US007745930B2

(12) United States Patent
Connah et al.

(10) Patent No.: US 7,745,930 B2
(45) Date of Patent: Jun. 29, 2010

(54) SEMICONDUCTOR DEVICE PACKAGES WITH SUBSTRATES FOR REDISTRIBUTING SEMICONDUCTOR DEVICE ELECTRODES

(75) Inventors: Norman Glyn Connah, Derbyshire (GB); Mark Pavier, West Sussex (GB); Phillip Adamson, Surrey (GB); Hazel D Schofield, Kent (GB)

(73) Assignee: International Rectifier Corporation, El Segundo, CA (US)

( * ) Notice: Subject to any disclaimer, the term of this patent is extended or adjusted under 35 U.S.C. 154(b) by 838 days.

(21) Appl. No.: 11/409,679

(22) Filed: Apr. 24, 2006

(65) Prior Publication Data

US 2006/0261473 A1 Nov. 23, 2006

Related U.S. Application Data

(60) Provisional application No. 60/674,616, filed on Apr. 25, 2005.

(51) Int. Cl.
*H01L 23/34* (2006.01)
(52) U.S. Cl. .............................. 257/728; 257/E23.026; 257/E23.039; 257/E23.094; 257/E23.066; 257/E23.067; 257/E23.068; 257/E23.092; 257/E23.101; 257/E25.016; 257/666; 257/698; 257/696; 257/778; 257/738; 257/734; 257/737
(58) Field of Classification Search ................. 257/728, 257/E23.026, E23.039, E23.044, E23.066, 257/E23.067, E23.068, E23.094, E23.092, 257/E23.101, E25.016, 666, 696, 698, 778, 257/738, 734, 737
See application file for complete search history.

(56) References Cited

U.S. PATENT DOCUMENTS

| 6,255,722 | B1 | 7/2001 | Ewer et al. |
| 6,380,569 | B1 | 4/2002 | Chang et al. |
| 6,404,065 | B1 | 6/2002 | Choi .......................... 257/782 |
| 6,441,520 | B1 * | 8/2002 | Grant ...................... 310/68 R |
| 6,545,364 | B2 | 4/2003 | Sakamoto et al. |
| 6,597,063 | B1 | 7/2003 | Shimizu et al. |
| 6,762,488 | B2 | 7/2004 | Maeda et al. |
| 6,798,060 | B2 | 9/2004 | Strauch ...................... 257/705 |
| 6,855,712 | B2 * | 2/2005 | Smith et al. ................. 514/249 |
| 6,933,593 | B2 * | 8/2005 | Fissore et al. ............... 257/675 |
| 2001/0012708 | A1 * | 8/2001 | Mizuno et al. ............. 439/76.1 |
| 2001/0030362 | A1 * | 10/2001 | Grant ......................... 257/712 |
| 2004/0026778 | A1 * | 2/2004 | Grant ......................... 257/706 |
| 2004/0094828 | A1 * | 5/2004 | Campbell et al. ........... 257/666 |
| 2005/0012541 | A1 | 1/2005 | Watanabe |
| 2006/0237825 | A1 * | 10/2006 | Pavier et al. ................ 257/666 |
| 2006/0238067 | A1 * | 10/2006 | Dausch ....................... 310/311 |
| 2007/0012947 | A1 * | 1/2007 | Larking ...................... 257/150 |

OTHER PUBLICATIONS

International Search Report dated Aug. 30, 2007 for PCT/US06/15376.
International Search Report dated Aug. 8, 2006 for PCT/US06/15377.

* cited by examiner

*Primary Examiner*—Alexander O Williams
(74) *Attorney, Agent, or Firm*—Farjami & Farjami LLP

(57) ABSTRACT

A semiconductor device package includes a substrate with one or more pads and at least one semiconductor device that has one or more of its electrodes electrically connected to the substrate pads. The package also includes one or more terminals in electrical connection with the substrate pads and that provide for external connection to the device.

17 Claims, 17 Drawing Sheets

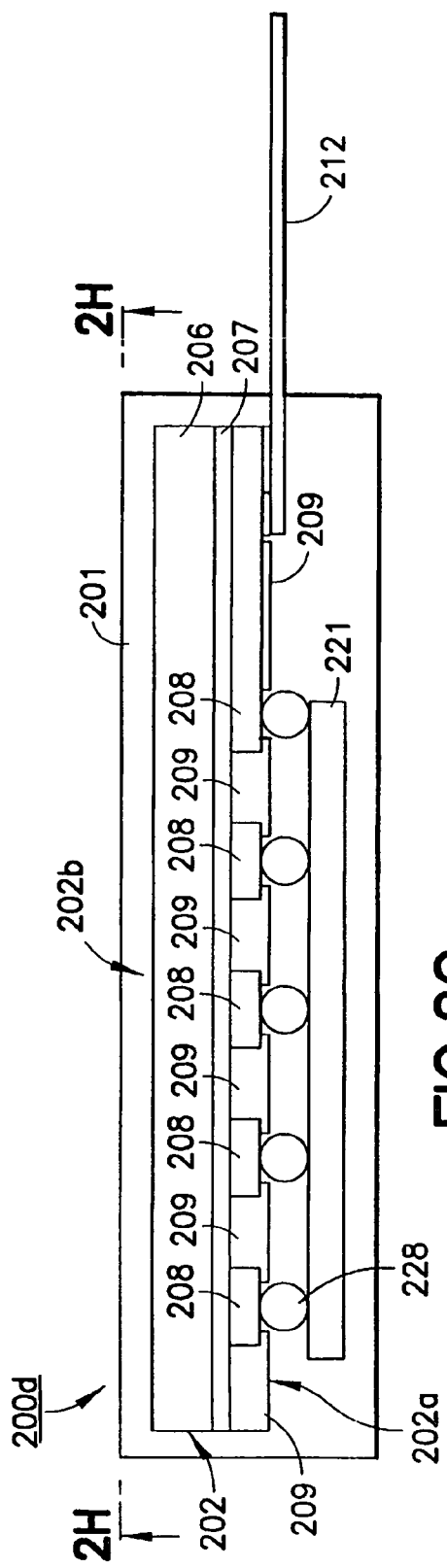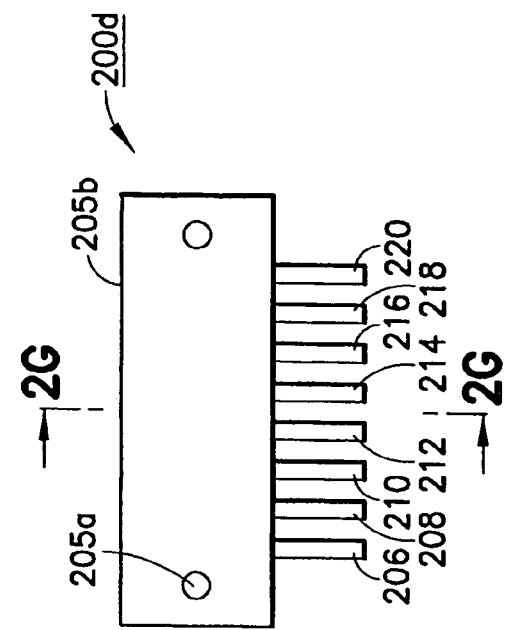

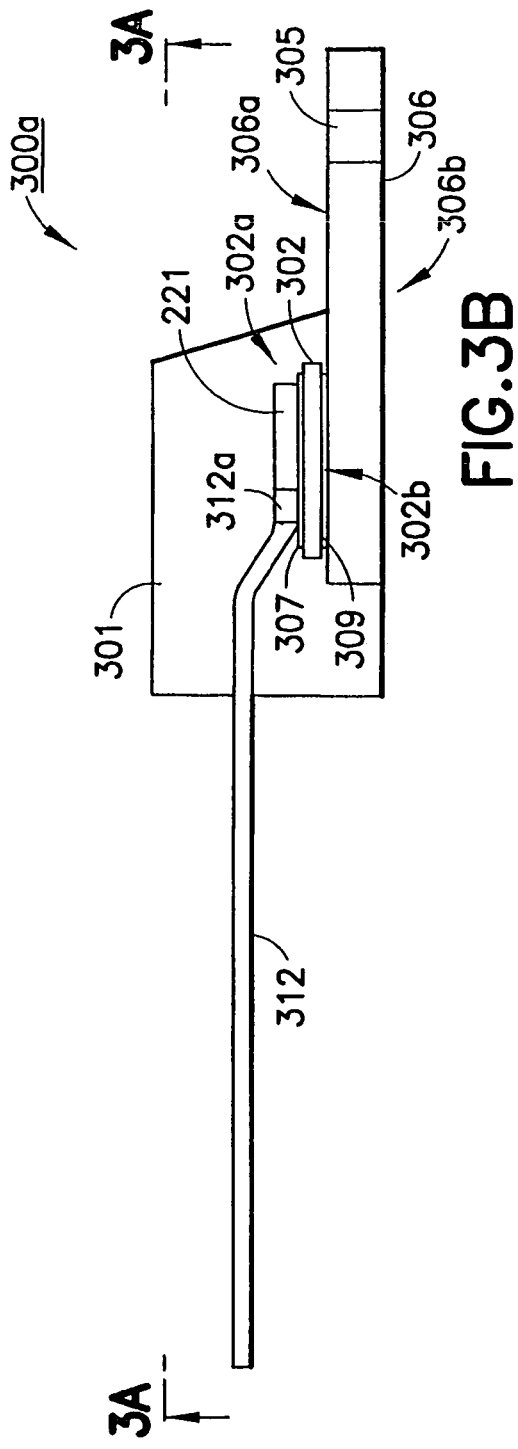
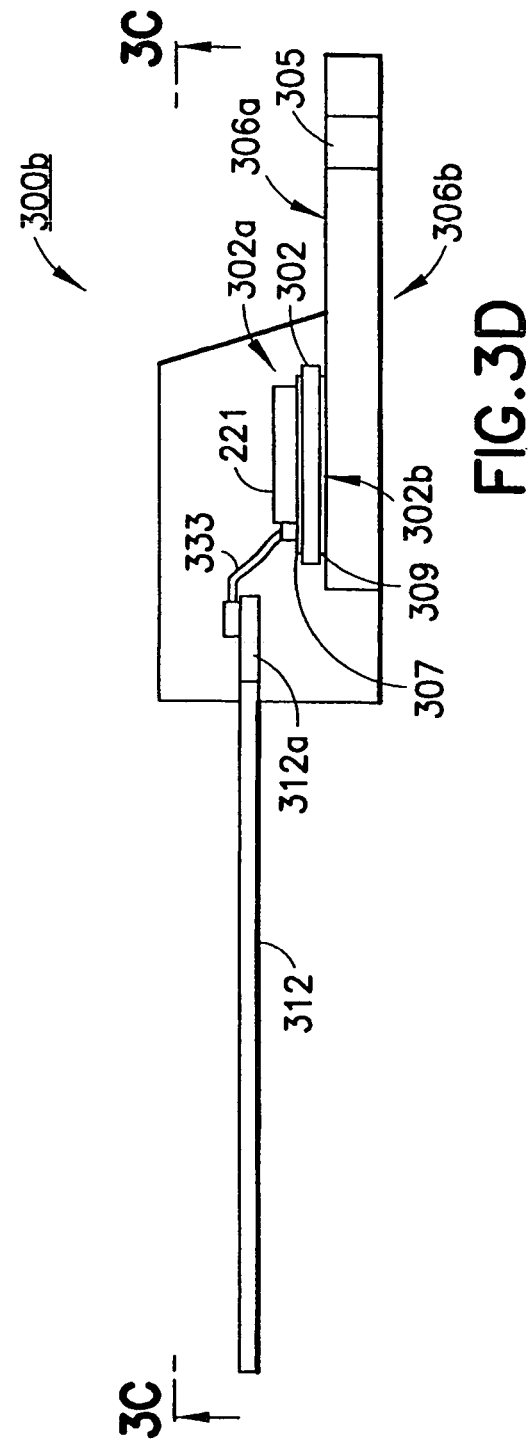

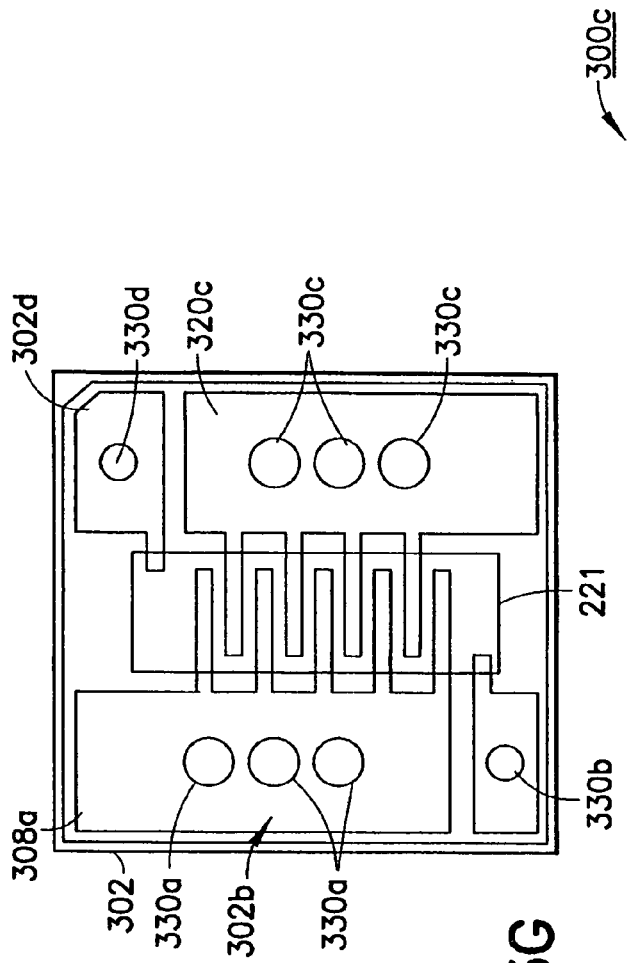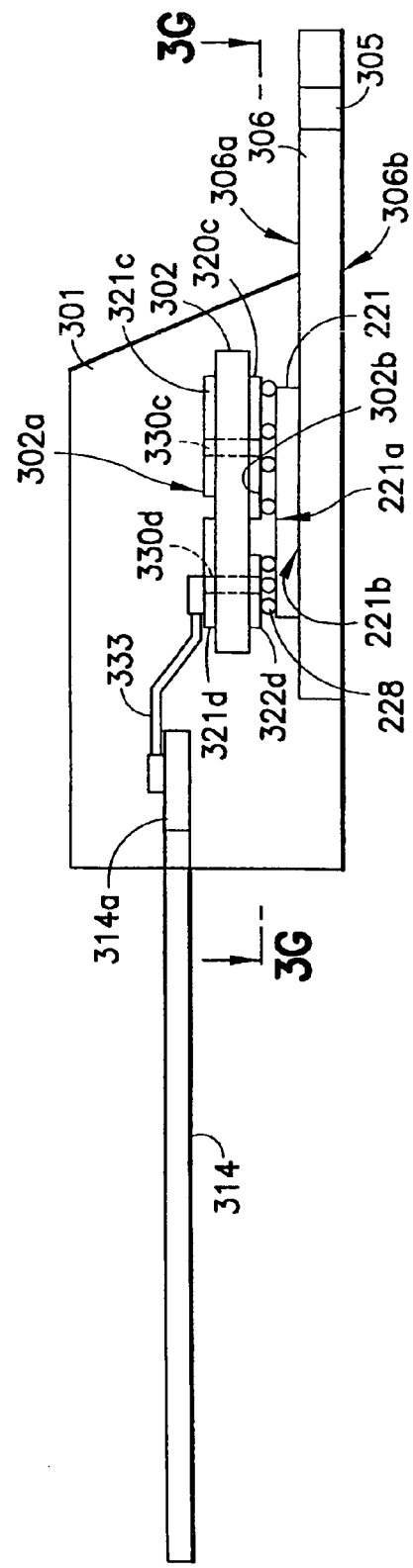

SEMICONDUCTOR DEVICE PACKAGES WITH SUBSTRATES FOR REDISTRIBUTING SEMICONDUCTOR DEVICE ELECTRODES

RELATED APPLICATIONS

This application is based on and claims priority to U.S. Provisional Application No. 60/674,616, filed on Apr. 25, 2005, by Glyn Connah et al., entitled, "SEMICONDUCTOR PACKAGE," the contents of which are herein incorporated by reference.

BACKGROUND OF THE INVENTION

1. Field of the Invention

This invention relates to semiconductor device packages and more specifically, relates to semiconductor device packages having substrates that redistribute the electrodes of the semiconductor devices housed therein.

2. Description of the Art

III-nitride based power semiconductor devices, such as Gallium Nitride (GaN) based devices, are desirable for power applications. Example III-nitride based devices include diodes, unidirectional switches, and bi-directional switches. These devices are lateral conductive devices with the power electrodes and control electrodes disposed along a top surface of the devices and with the bottom surface of the devices being electrically non-conductive.

Referring to FIG. 1 there is illustrated an example III-nitride based power device 121. Device 121 is a unidirectional switch that includes a control/gate electrode 122 and first and second power electrodes 123 and 124, one power electrode being the source electrode and the other power electrode being the drain electrode. As shown, the two power electrodes are interdigited and may include elongated runners 123a and 124a that extend along respective edges of device 121. Notably, if device 121 were a bi-directional switching device, power electrodes 123 and 124 would both be source electrodes and the device may further include a second control/gate electrode. A III-nitride based bi-directional switching device may have a form as disclosed in U.S. Publication No. US 2005-0189561 (U.S. patent application Ser. No. 11/056,062), entitled "III-Nitride Bidirectional Switch," by Daniel M. Kinzer et al., and assigned to the assignee of the present application. The contents of U.S. Publication No. US 2005-0189561 are hereby incorporated by reference as if fully set forth in its entirety herein. Similarly, if device 121 were a diode, the device would only include power electrodes 123 and 124. When packaging a device such as device 121, wire bonds may be formed from a contact pad of control/gate electrode 122 and from elongated runners 123a and 124a to the terminal leads of the device package to connect the terminal leads to the device electrodes.

Notably, a III-nitride based power semiconductor device may have a very small area, thereby making the electrodes of the device also very small. The small size of these electrodes can create substantial problems when interfacing to the electrodes. For example, as indicated above a III-nitride based device may be mounted within a device package that has one or more terminal leads, with wire bonds being formed directly between the terminal leads and device electrodes. Notably, the small size of the electrodes can make it difficult to form these wire bonds. Similarly, small electrodes often prohibit the direct mounting of devices to an end customer's circuit board. This is due to the spacing between the electrodes on the III-nitride based devices being significantly less than the spaces achievable using printed circuit board patterning processes.

In addition to III-nitride based devices, lateral conductive silicon-based power devices may also have very small areas, thereby again resulting in electrodes of a very small size. Accordingly, such devices may also exhibit similar problems as described above.

BRIEF SUMMARY OF THE INVENTION

Accordingly, it is desirable to provide device packages that allow for simplified interconnection to semiconductor devices with small electrodes, thereby overcoming the above and other disadvantages of the prior art. According to an embodiment of the invention, a semiconductor device package includes a substrate, such as an insulated metal substrate (IMS), that has a plurality of conductive pads formed on a top surface thereof. According to this embodiment of the invention, the substrate may be formed to have an outline that resembles a TO style package header, such as a TO-220 package header, so that the package conforms to a TO package format. Alternatively, the substrate may conform to a single inline package (SIP) format, for example. One skilled in the art will recognize that other package formats may be used.

According to an embodiment of the invention, the device package also includes at least one semiconductor device, such as a III-nitride based power semiconductor device (e.g., a GaN-based device), and a plurality of terminal leads. The semiconductor device is mounted to the top surface of the substrate, with the device electrodes electrically connected to respective pads. In particular, according to an embodiment of the invention, the semiconductor device may be mounted such that one or more device electrodes are connected to respective pads through wire bonds. Alternatively, the device may be mounted in a flip-chip orientation on the substrate pads. According to an embodiment of the invention, the terminal leads may be directly electrically connected using a conductive adhesive (e.g., solder, silver filled epoxy, or similar low electrical resistivity adhesive material) to each of the substrate pads that are interfaced to the device electrodes, thereby providing external access to the device. The device package also includes a protective housing that covers at least portions of the substrate, semiconductor device, and terminal leads.

According to another embodiment of the invention, a semiconductor device package includes a substrate, such as an IMS substrate or a ceramic substrate, that has a plurality of conductive pads formed on a top surface thereof. According to this embodiment of the invention, the device package also includes a package header made of a high thermal conductivity material such as copper or an alloy of copper, which header acts as a heat spreader. The bottom surface of the substrate is mounted to the top surface of the package header. The header may have a form that resembles a TO style package header for example, thereby conforming the device package to a TO package format. Nonetheless, the device package may have other forms. Similar to above, at least one semiconductor device is mounted to the top surface of the substrate, with one or more device electrodes electrically connected to respective pads either through wire bonds or by flip-chip mounting the device on the pads. The device package also includes a plurality of terminal leads that are electrically connected to the substrate pads to provide external access to the device. According to this embodiment of the invention, the terminal leads may be directly connected to the pads using a conductive adhesive. Alternatively, the terminal leads may be connected to the substrate pads using one or more wire bonds.

According to another embodiment of the invention, a semiconductor device package includes a substrate, such as a ceramic substrate, an IMS substrate, or an organic substrate (e.g., one made from a FR4 resin, a Polyimide resin, or a BT resin), which substrate has a plurality of conductive pads formed on both a top surface thereof and a bottom opposing surface thereof. According to an embodiment of the invention, at least one lateral conductive semiconductor device with an electrically non-conductive bottom surface is mounted on the pads along the bottom surface of the substrate in a flip-chip orientation. The device package also includes a plurality of terminal leads that are electrically connected to the substrate pads along the top surface of the substrate and that provide external connection to the semiconductor device. The terminal leads may be connected to the pads either directly or through wire bonds. In order to connect the terminal leads to the device electrodes, conductive vias are formed through the substrate, which vias electrically connect respective pads on the top and bottom surfaces of the substrate. According to this embodiment of the invention, the device package also includes a package header made of a high thermal conductivity material, which header acts as a heat spreader, similar to above. Here, however, the heat spreader is mounted to the electrically non-conductive bottom surface of the semiconductor device. Similar to above, the header may have a form that resembles a TO style package header for example, thereby conforming the device package to a TO package format, although other package formats may be used.

According to another embodiment of the invention, a semiconductor device package includes a substrate and a plurality of terminal leads with integral pads, which terminal leads and pads are directly formed on a bottom surface of the substrate. According to an embodiment of the invention, at least one lateral conductive semiconductor device is directly mounted to the terminal lead pads in a flip-chip orientation and as such, the pads are configured to receive the device electrodes. According to an embodiment of the invention, the device package may also include a heat spreader mounted to the top surface of the substrate. According to this embodiment of the invention, the device package may conform to a surface mount package format, such as SO package format or a quad flat pack (QFP) package format. According to another embodiment of the invention, the device package may conform to a through hole package format, such as a dual inline package (DIP) format or TO package format. Again, one skilled in the art will recognize that other package formats may be used.

According to another embodiment of the invention, a semiconductor device package includes a substrate and a plurality of terminal leads with integral pads, which terminal leads and pads are directly formed on a bottom surface of the substrate, as similarly described above. The substrate also includes a plurality of conductive pads formed on a top surface thereof. According to an embodiment of the invention, at least one lateral conductive semiconductor device with an electrically non-conductive bottom surface is mounted on the pads along the top surface of the substrate in a flip-chip orientation. In order to connect the terminal leads to the device electrodes, conductive vias are formed through the substrate, which vias electrically connect respective pads on the top and bottom surfaces of the substrate. According to an embodiment of the invention, the device package may also include a heat spreader mounted to the electrically non-conductive bottom surface of the semiconductor device. Similar to above, the device package may conform to a SO format, a QFP format, a DIP format, or a TO format, although other package formats may be used.

According to another embodiment of the invention, a semiconductor device package includes a substrate that has a plurality of conductive pads formed on both a top surface thereof and a bottom opposing surface thereof. At least one lateral conductive semiconductor device with an electrically non-conductive bottom surface is mounted on the pads along the top surface of the substrate in a flip-chip orientation. According to this embodiment of the invention, the pads along the bottom surface of the substrate are within the boundary of the substrate and act as terminal pads that directly contact the end-user circuit board, thereby providing external access to the device. As such, a device package according to this embodiment of the invention has the form of a surface mount device. In order to connect the terminal pads to the device electrodes, conductive vias are formed through the substrate, which vias electrically connect respective terminal pads on the bottom surface of the substrate to pads on the top surface of the substrate. According to an embodiment of the invention, the device package may also include a heat spreader mounted to the electrically non-conductive bottom surface of the semiconductor device.

Notably, the substrates of the device packages of the present invention operate to re-distribute the electrodes of the one or more devices secured thereto to the pads of the substrate. The terminal leads are then electrically connected to the substrate pads interfaced to the device electrodes. In general, such a configuration is advantageous when the devices have small electrodes because the terminal leads may be more easily connected to the larger substrate pads as compared to directly connecting the terminal leads to the device electrodes through wire bonds, for example. Similarly, in the case of the surface mount device, the terminal pads of the substrate may be more easily mounted to end-user circuit board as compared to the electrodes of the device.

Other features and advantages of the present invention will become apparent from the following description of the invention which refers to the accompanying drawings.

BRIEF DESCRIPTION OF THE DRAWINGS

FIG. 2G illustrates a cross sectional side view of a semiconductor device package according to another embodiment of the invention, the package including a substrate conforming to a single inline package format, and also including a semiconductor device and terminal leads mounted to the substrate.

FIG. 2H illustrates a top view of the semiconductor device package of FIG. 2G according to an embodiment of the invention.

FIGS. 3A and 3B illustrate a top view and a cross sectional side view of a semiconductor device package according to another embodiment of the invention, the package including a substrate mounted to a package header, and also including a semiconductor device and terminal leads mounted to the substrate.

FIGS. 3C and 3D illustrate a top view and a cross sectional side view of a semiconductor device package according to another embodiment of the invention, the package being similar to the device package of FIGS. 3A and 3B but with the terminal leads wire bonded to the substrate.

FIGS. 3E and 3F illustrate a top view and a cross sectional side view of a semiconductor device package according to another embodiment of the invention, the package including a semiconductor device with its back side mounted to a package header and its top side electrically connected to a bottom surface of a substrate, the substrate electrically connecting the device to terminal leads electrically connected along a top surface of the substrate.

FIG. 3G illustrates a bottom view of a portion of the semiconductor device package of FIGS. 3E and 3F according to an embodiment of the invention.

DETAIL DESCRIPTION OF THE INVENTION

Figure 1:
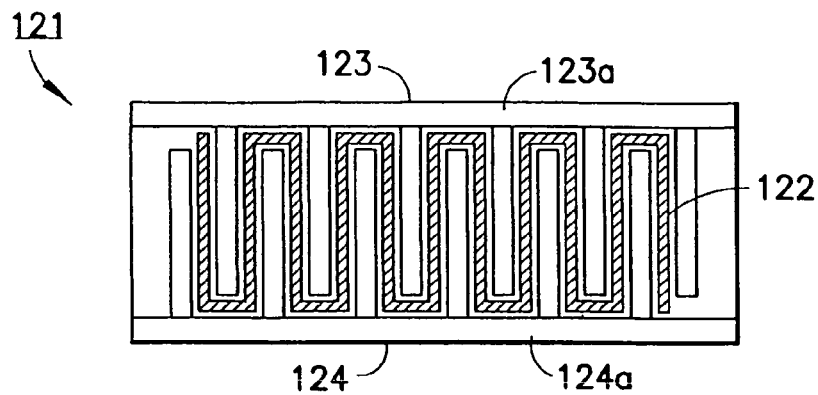
FIG. 1 illustrates a top view of a III-nitride based unidirectional switching device of the prior art.
Figure 2B:
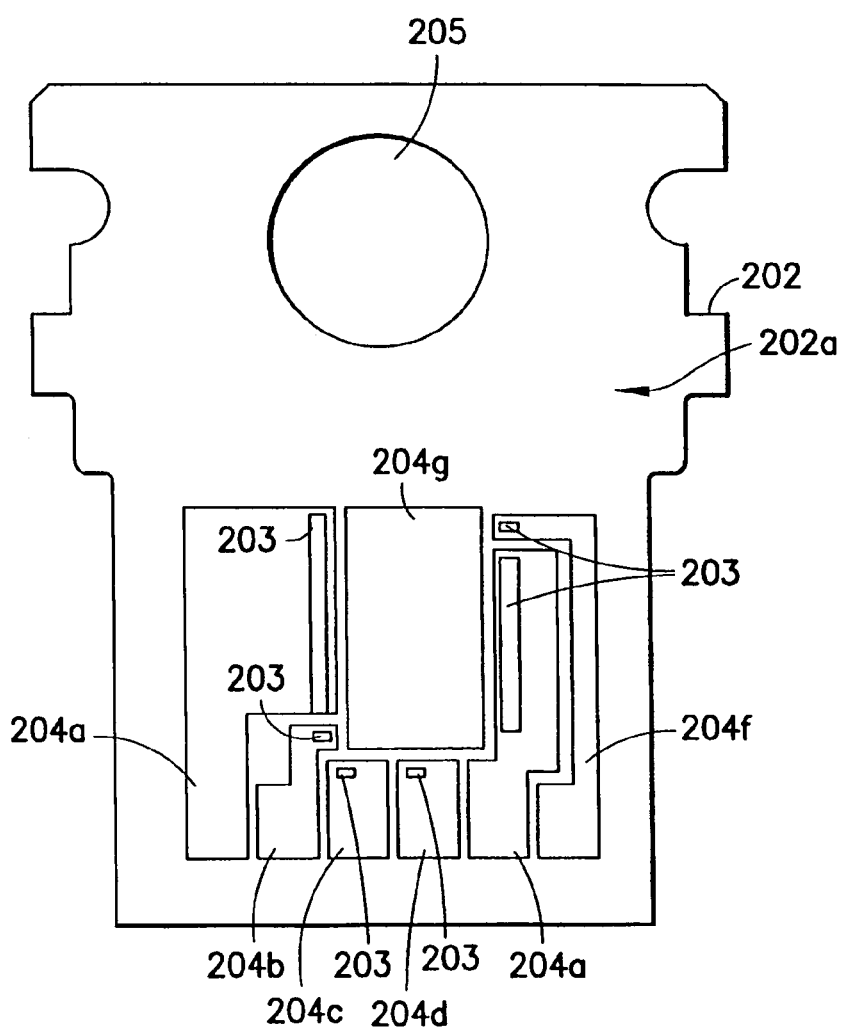
FIG. 2B illustrates a top view of the substrate shown in FIG. 2A with the semiconductor device and terminal leads removed.
Figure 2A:
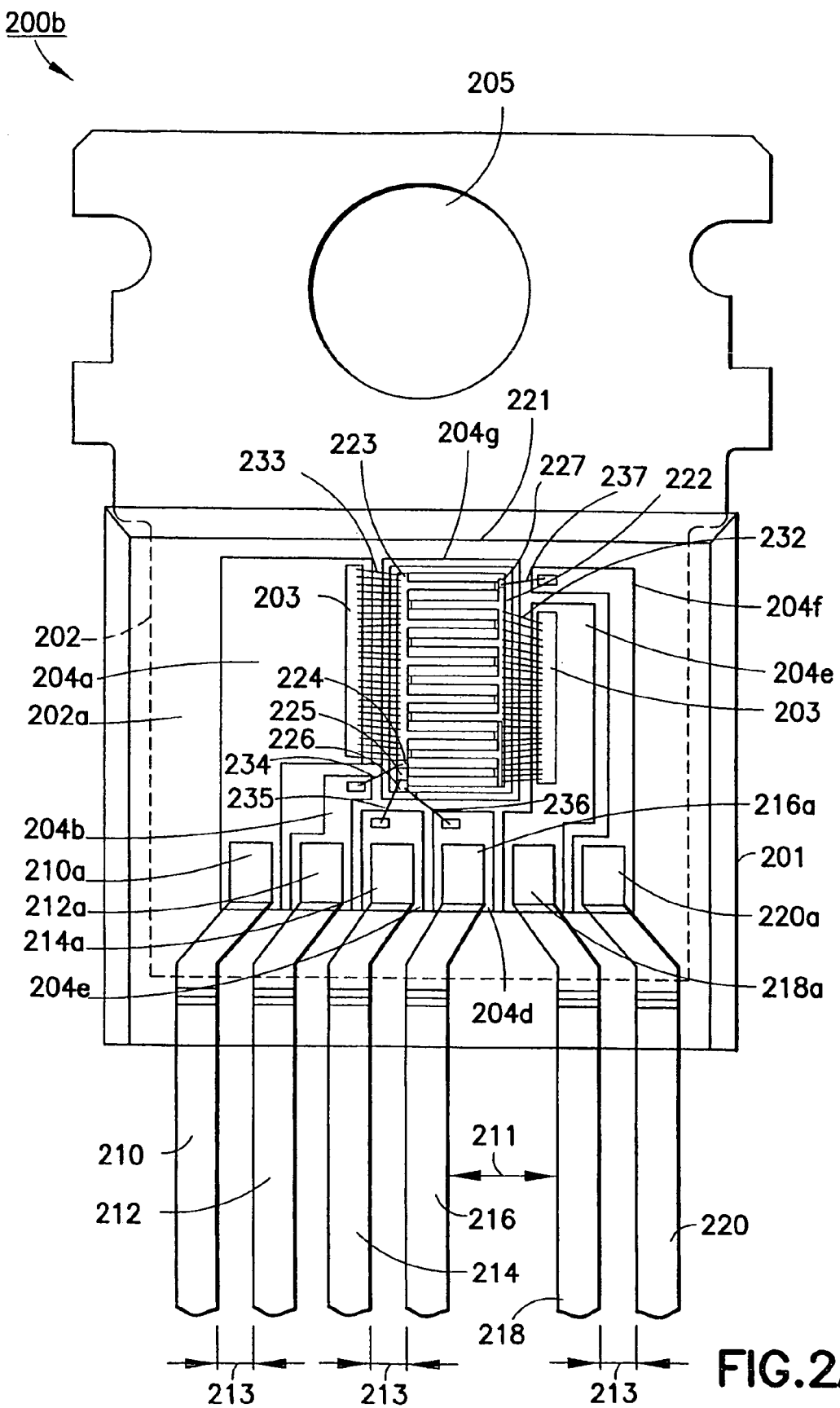
FIG. 2A illustrates a top view of a semiconductor device package according to an embodiment of the invention, the package including a substrate formed as a package header, and also including a semiconductor device and terminal leads mounted to the substrate.

Referring to FIG. 2A, there is shown a top view of a semiconductor device package 200a according to an embodiment of the invention (note that FIG. 2A has the housing shown as see through). Device package 200a includes substrate 202 and a plurality (i.e., two or more) of terminal leads, such as leads 210, 212, 214, 216, 218, and 220. Device package 200a also includes at least one semiconductor device, such as device 221, disposed on a top surface 202a of substrate 202, and includes a plurality of wire bonds, such as wire bonds 232, 233, 234, 235, 236, and 237, that electrically connect the electrodes of device 221 to terminal leads 210-220, as further described below. A housing 201 covers at least a portion of the top surface 202a of substrate 202, including device 221, wire bonds 232-237, and a portion of terminal leads 210-220. According to an embodiment of the invention, device package 200a may conform to a TO style package format, such as a TO-220 package format as shown in FIG. 2A, a TO-247 package format, etc. Nonetheless, device package 200a is not limited to a TO style package format and may have other forms.

Figure 2C:
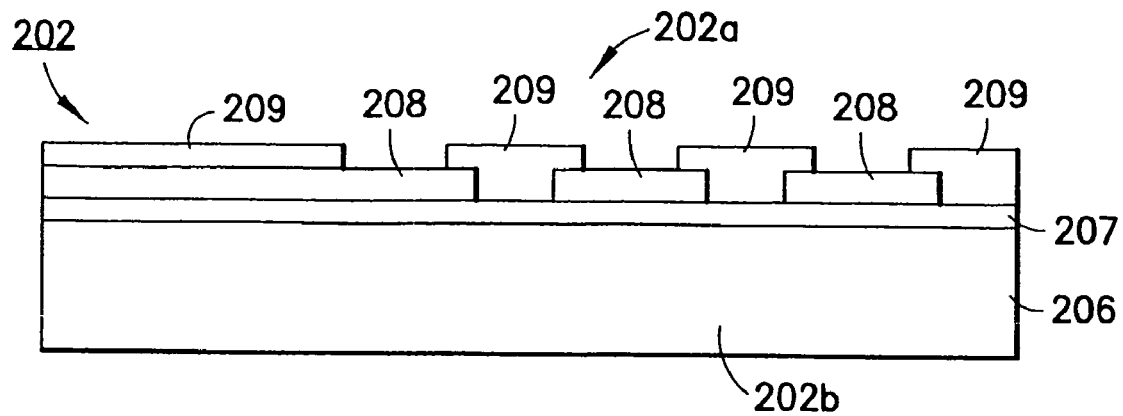
FIG. 2C illustrates a cross sectional side view of an example IMS substrate.

Referring now to FIGS. 2B and 2C, substrate 202 is shown in greater detail, with FIG. 2B showing a top view of the substrate and FIG. 2C showing an example cross-sectional side view of the substrate (note that FIG. 2B is similar to FIG. 2A but does not show device 221, wires bonds 232-237, and terminal leads 210-220). According to an embodiment of the invention, substrate 202 is an insulated metal substrate (IMS). IMS substrate 202 includes a metal base/substrate layer 206 made of aluminum, for example. IMS substrate 202 also includes on a top surface 202a thereof an electrically conductive circuit layer 208 that is etched, for example, to form a plurality of pads and/or traces, such as pads 204a, 204b, 204c, 204d, 204e, 204f, and 204g as shown in FIG. 2B. Circuit layer 208/pads 204a-204g may be made of copper or some other conductive material. One skilled in the art will recognize that device package 200a is not limited to the number, shape, and/or configuration of the pads as shown in FIG. 2B.

IMS substrate 202 also includes a dielectric layer 207 disposed between base layer 206 and circuit layer 208. This dielectric layer 207 electrically isolates the circuit layer and base layer from one another, ideally has a high thermal conductivity, and bonds the circuit layer to the base layer. Over a portion of the top surface 202a of IMS substrate 202 may be a solder mask/solder resist layer 209 that partially covers pads 204a-204g, for example. Solder mask 209 may be used to confine the conductive adhesive material used in the package assembly to localized pads on the package, thus reducing the risk of bridging two pads and creating an electrical short.

According to an embodiment of the invention and as shown in FIGS. 2A and 2B, IMS substrate 202 may be singulated to have an outline that resembles the package header/base of a TO-220 package, thereby conforming package 200a to a TO-220 package format. Nonetheless, IMS substrate 202 may have other TO style package header outlines for example, as indicated above. IMS substrate 202 may be singulated using techniques such as stamping, v-scoring, routing, or laser cutting, for example. When IMS substrate 202 is formed to resemble a TO-220 package header for example, a mounting hole 205 may be formed within the tab extension of the substrate in order to attach the bottom surface 202b of the substrate to a heat-sink.

Referring again to FIG. 2A and to terminal leads 210-220, these terminal leads may be made of copper and provide external access to device 201. While device package 200a is shown as having six leads, one skilled in the art will recognize that the package may include more than or fewer than six leads. According to this embodiment of the invention, a bond pad 210a-220a of each terminal lead may be directly and electrically bonded to a respective pad of IMS substrate 202, such as pads 204a-204f as shown in FIG. 2A. The terminal lead bond pads 210a-220a may be bonded to the substrate pads 204a-204f using, for example, an electrically conductive adhesive such as solder, silver filled epoxy, or similar low electrical resistivity adhesive material. One skilled in the art will recognize that device package 200a is not limited to the configuration of terminal leads to pads as shown in FIG. 2A. For example, two or more leads may be electrically connected to the same pad.

As illustrated in FIG. 2A, terminal leads 210-220 may be parallel and co-planar with each other and extend from package 200a along the same edge beyond the outer boundary of substrate 202 and beyond the periphery of insulated housing 201, thereby allowing for external connection to device 221. Nonetheless, one skilled in the art will recognize that the terminal leads do not need to be co-planar with each other and may extend from multiple sides of the device package, for example, depending on the form of the package.

As also illustrated in FIG. 2A, according to an embodiment of the invention each pair of adjacent leads (e.g., leads 210/212, 212/214, 214/216, and 218/220) may be spatially separated by substantially the same distance 213 except for one pair of leads (e.g., leads 216/218), which may be spatially separated by a distance 211 that is larger than distance 213. This increased spatial separation may be formed to spatially separate leads that may be interfaced to high voltage electrodes of device 221. By separating high voltage leads in this fashion, the creepage distance between the leads is increased.

Referring now to semiconductor device 221, this device may be a III-nitride based power semiconductor device, such as a GaN-based power device, and in particular, may be a unidirectional switch, a bi-directional switch, or a diode. Device 221 may also be a GaN power device containing some integrated control circuitry. Nonetheless, device 221 does not need to be a III-nitride based device and may be some other power device, including a vertical or a lateral conductive device. According to this embodiment of the invention, the bottom surface of device 221 is mounted to the top surface 202a of substrate 202 and in particular, may be mounted to a pad, such as pad 204g, for example. In this way, the electrodes along the top surface of the device are exposed. Device 221 may be mounted to substrate 202 using, for example, a thermally and electrically conducting adhesive such as solder, epoxy adhesive, or the like.

According to this embodiment of the invention, the electrodes along the top surface of device 221, such as electrodes 222-227, may be electrically connected through wire bonds, such as bonds 232-237, to the pads of substrate 202 and thereby to terminal leads 210-220. In this way, the terminal leads provide external access to device 221. The wire bonds may be formed, for example, from gold or aluminum. The pads to which the wire bonds are formed may have a wire bondable body/finish 203 formed of gold for example, to facilitate connecting the bonds to the pads.

As an example and as illustrated in FIG. 2A, device 221 may be a GaN-based bi-directional switching device that includes first and second gate electrodes 226 and 227 and first and second source electrodes 222 and 223 along the top surface of the device. The device may also include a temperature sense electrode 224 and a current sense electrode 225, although the temperature sense electrode and/or current sense electrode are not essential. Gate electrode 227 may be bonded by wire bond 237 to pad 204f and thereby to terminal lead 220, the runner of source electrode 222 may be bonded by a plurality of wire bonds 232 to pad 204e and thereby to terminal lead 218, the runner of source electrode 223 may be bonded by a plurality of wire bonds 233 to pad 204a and thereby to terminal lead 210, gate electrode 226 may be bonded by wire bond 236 to pad 204d and thereby to terminal lead 216, temperature sense electrode 224 may be bonded by wire bond 234 to pad 204b and thereby to terminal lead 212, and current sense electrode 225 may be bonded by wire bond 235 to pad 204c and thereby to terminal lead 214. Nonetheless, one skilled in the art will recognize that these electrode to terminal lead assignments can vary depending on the device and/or application. In addition, the device electrodes may be connected to multiple pads and/or to multiple terminal leads, for example.

As indicated above, the power electrodes of a III-nitride based device are interdigited with elongated runners for securing the wire bonds to the device. According to an embodiment of the invention, when device 221 is a III-nitride based device, the pads of the IMS substrate that are connected to the power electrodes may be formed to extend substantially along the length of the electrodes/runners. For example, as illustrated in FIG. 2A, pad 204a and pad 204e are each formed such that when device 221 is mounted to the substrate, the pads extend adjacent to and substantially along the length of source electrode 223 and source electrode 222, respectively. Notably, if the pads are not formed in this fashion, the plurality of wire bonds, such as wire bonds 233 and 232, that extend between a given power electrode and pad may have varying lengths. Because of these varying lengths, the wire bonds will have different resistances, resulting in unequal current distribution across the wire bonds. By forming the pads to extend along the lengths of the power electrodes, the wire bonds that connect each power electrode to a respective pad may be made to have substantially the same/equal length and may be connected substantially in parallel, as shown in FIG. 2A. Because of the equal lengths of the wire bonds for a given electrode-pad pair, the wire bonds will have substantially the same resistance, thereby creating equal current distribution across the bonds and device.

Referring now to housing 201, this housing may be formed from any suitable material known in the art, such as plastic. When package 200a has the form of a TO-220 package for example, the housing may extend over the lower portion of the top surface 202a of IMS substrate 202, thereby covering device 221, pads 204a-204g, wire bonds 232-237, and portions of leads 210-220. Here, the bottom surface 202b of IMS substrate 202 may remain exposed so that this surface may directly contact a heat sink and thereby enable efficient heat sinking. Alternatively, IMS substrate may be over-molded such that housing 201 extends over at least a portion of the bottom surface 202b of the substrate, thereby enabling additional electrical isolation.

As can be seen, according to this embodiment of the invention, IMS substrate 202 of device package 200a operates to re-distribute the electrodes of device 221 to pads 204a-204f, which pads are then interfaced to the terminal leads. Such a configuration may be advantageous when device 221 has small electrodes for example, because the substrate re-distributes the small electrodes of the device to the larger pads of the substrate. Terminal leads 210-220 may be more easily connected to these larger substrate pads as compared to directly connecting the terminal leads to the device electrodes through wire bonds, for example.

Figure 2E:
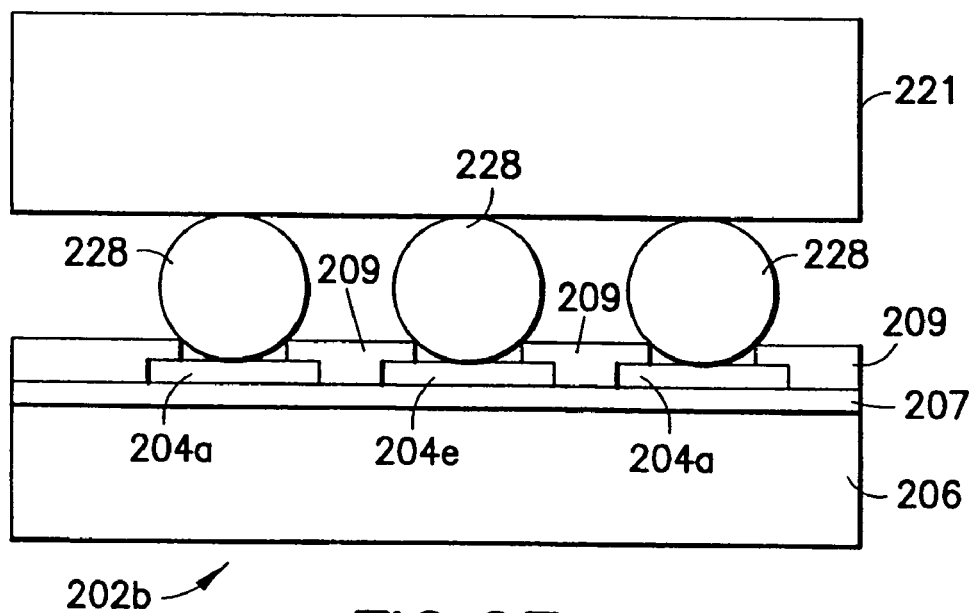
FIG. 2E illustrates a cross sectional side view of a portion of the substrate and semiconductor device of FIG. 2D according to an embodiment of the invention.
Figure 2D:
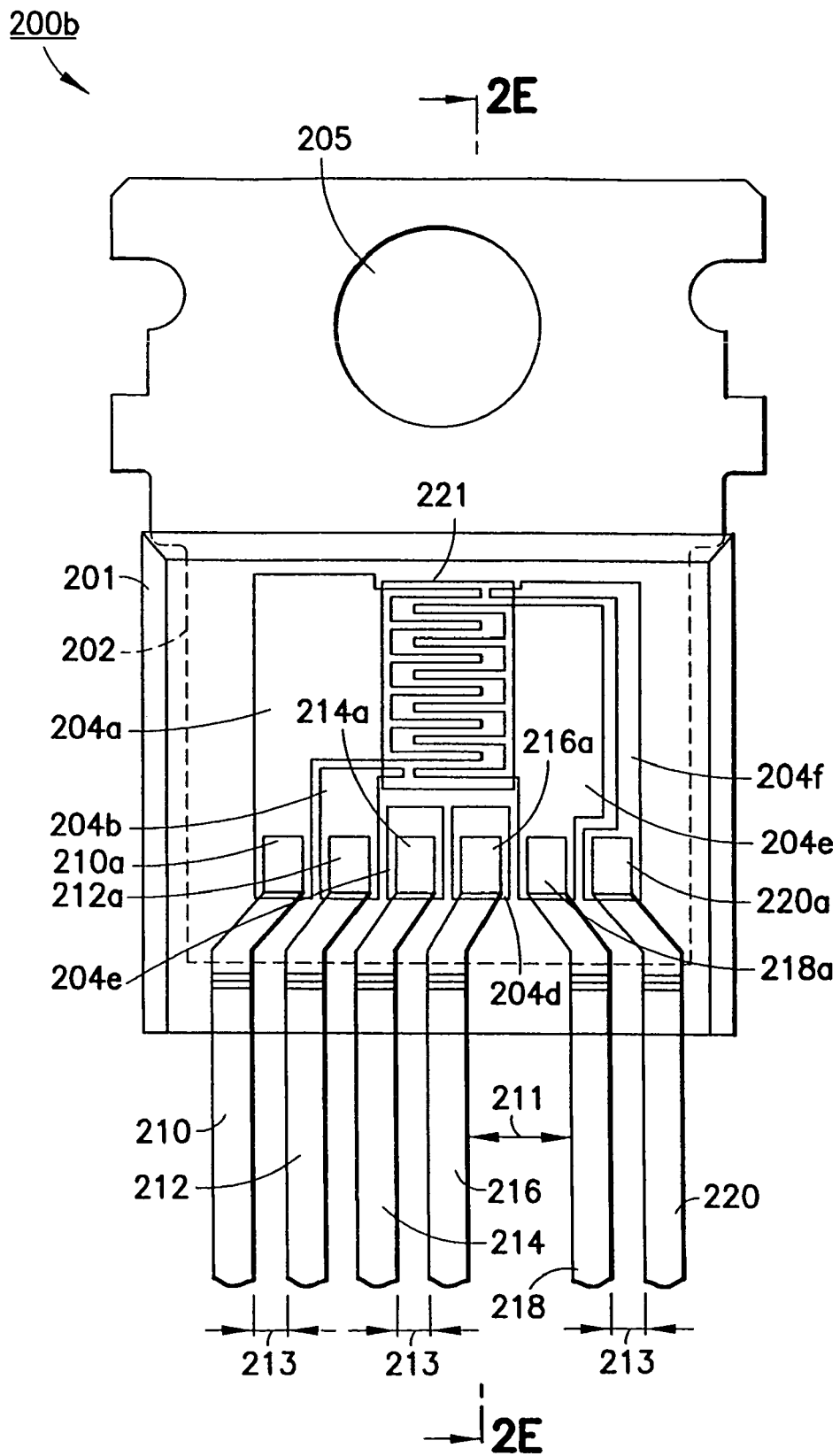
FIG. 2D illustrates a top view of a semiconductor device package according to another embodiment of the invention, the package being similar to the device package of FIG. 2A but with the semiconductor device mounted in a flip-chip orientation.

Referring now to FIG. 2D, there is shown a top view of a semiconductor device package 200b according to another embodiment of the invention (note that FIG. 2D has the housing shown as see though). Package 200b is similar to package 200a and includes an IMS substrate 202, at least one semiconductor device, such as device 221, a plurality of terminal leads, such as leads 210-220, and a housing 201. According to this embodiment of the invention, however, device 221 is now a lateral conductive device for example, and is mounted in a flip-chip orientation such that the electrode(s) on the top surface of the device directly contact pads on the top surface 202a of substrate 202. Device 221 may be a III-nitride based power device or some other lateral conductive device, for example. Note that in FIG. 2D, device 221 is shown as see through thereby showing the pads of substrate 202. Similar to device package 200a, device package 200b may conform to a TO style package format, such as a TO-220 package format as shown in FIG. 2D, but is not limited to this form.

Beginning with substrate 202, this substrate is as described above for device package 200a and includes an electrically conductive circuit layer 208 that is etched, for example, to form a plurality of pads, such as pads 204a-204f. Again, one skilled in the art will recognize that device package 200b is not limited to six pads and may have fewer than or more than six pads. Circuit layer 208 may be formed using thin copper of 1 oz. or less for example, in order to provide fine pitch pads. Fine pitch pads may be useful when device 221 is a III-nitride based device for example, the fine pitch enabling interconnection between the pads and the small electrodes of the III-nitride based device.

According to this embodiment of the invention and as illustrated in FIG. 2D, the pads of substrate 202 that are intended to interface the electrodes of device 221, such as pads 204a, 204b, 204e, and 204f, are formed to extend within the foot-print of device 221. In this way, the electrodes of the device will contact the substrate pads when the device is mounted in the flip-chip orientation. When device 221 is a III-nitride based device, these pads preferably have a shape that substantially conforms to the shape of the electrodes of the device. Specifically, the pads that are to receive the power electrodes of the device are preferably interdigited in shape, as shown by pads 204a and 204e for example, in order for the pads to conform to the interdigited power electrodes of the III-nitride based device.

Referring now to terminal leads 210-220, according to this embodiment of the invention the bond pads 210a-220a of these terminal leads may be electrically and directly connected to the substrate pads 204a-204f using, for example, an electrically conductive adhesive such as solder. Again, one skilled in the art will recognize that device package 200b is not limited to the configuration of terminal leads to pads as shown in FIG. 2D and device package 200b is also not limited to six terminal leads and may include more than or fewer than six leads. As also illustrated in FIG. 2D, a space 211 may be formed between a pair of adjacent terminal leads in order to spatially separate leads that may be interfaced to high voltage electrodes of device 221, as similarly described above.

Turning to device 221, as indicated above, according to this embodiment of the invention the device is mounted in a flip-chip orientation such that the electrodes on the top surface of the device contact the pads of the substrate. The electrodes of the device may be connected to the pads using an electrically conductive adhesive. In particular, as shown in FIG. 2E (which is a cross section side view of a portion of substrate 201 and device 221 as seen along line 2E of FIG. 2D), a plurality of conductive bumps 228 may be formed on the device to ready the device for flip-chip mounting. Bumps 228 may be formed of gold, copper, lead free solder or any suitable conductive adhesive or combinations of the above. For example the bumps may be formed of copper with a solderable finish. According to an embodiment of the invention, device 221 may also be underfilled to create additional mechanical stability and to improve the reliability of device package 200b.

As an example and as shown in FIG. 2D, device 221 may be a GaN-based bi-directional switching device that includes first and second gate electrodes and first and second source electrodes along the top surface of the device. Here, the first gate electrode may be electrically connected to pad 204b and thereby to terminal lead 212, the second gate electrode may be connected to pad 204f and thereby to terminal lead 220, the first source electrode may be connected to pad 204a and thereby to terminal lead 210, and the second source electrode may be connected to pad 204e and thereby to terminal lead 218. Again, one skilled in the art will recognize that these electrode to pad/terminal lead assignments may vary depending on the device and/or application. In addition, the electrodes of the device may be connected to multiple terminal leads, for example.

As for housing 201, this housing is as described above for package 200a and may be configured such that the bottom surface 202b of substrate 202 is exposed or may be overmolded to cover the bottom surface of the substrate.

Similar to device package 200a, IMS substrate 202 of device package 200b operates to re-distribute the electrodes of device 221 to the larger substrate pads, which pads are then interconnected to the terminal leads. As indicated above, such a configuration may be advantageous when the device has small electrodes in that it allows for easier interconnection between the electrodes and the terminal leads of the package.

Figure 2F:
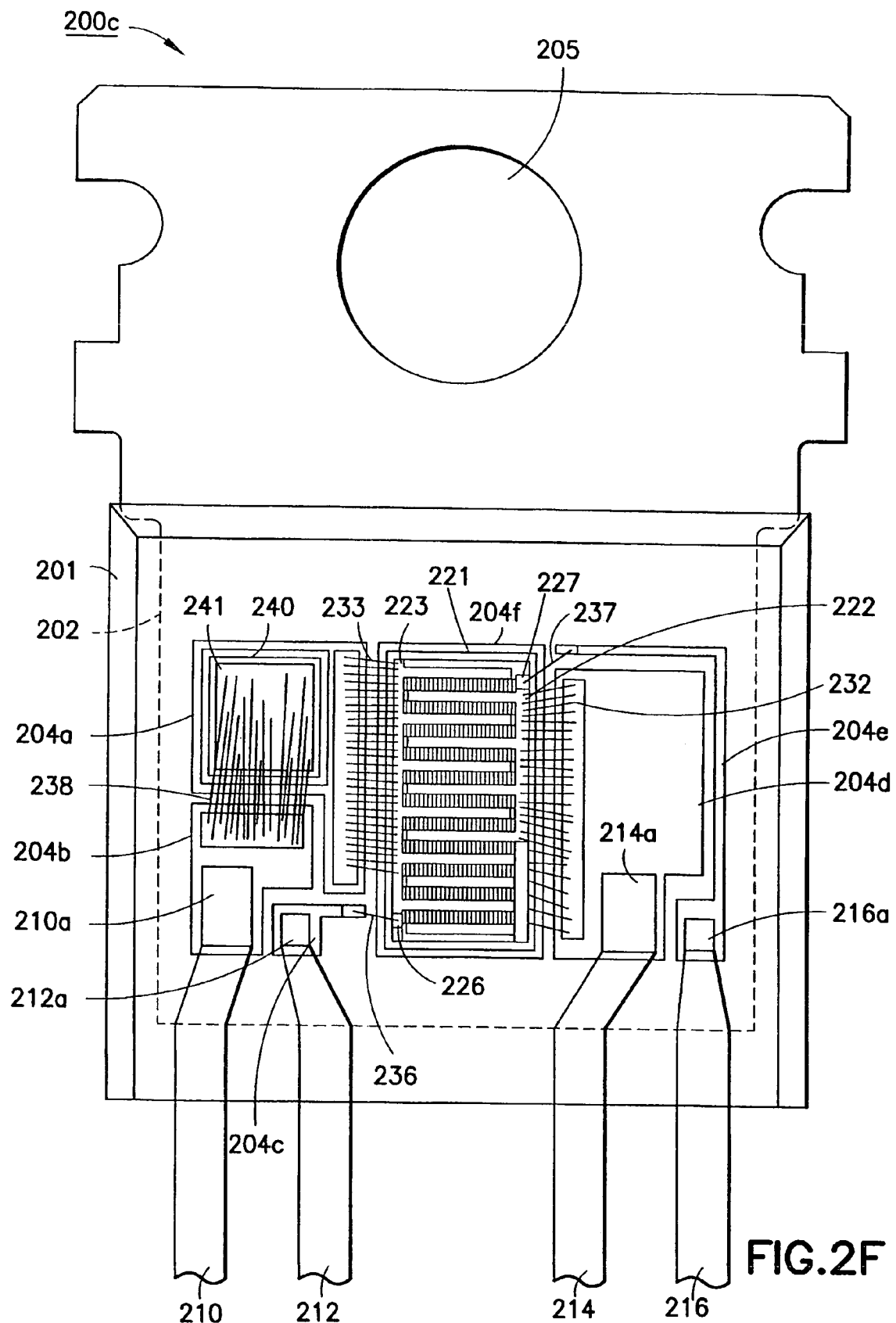
FIG. 2F illustrates a top view of a semiconductor device package according to another embodiment of the invention, the package including a substrate formed as a package header, and also including two semiconductor devices mounted to the substrate.

Referring now to FIG. 2F, there is illustrated a top view of an example semiconductor device package 200c according to another embodiment of the invention. Device package 200c resembles device package 200a, for example, but now includes two or more semiconductor devices, such as devices 221 and 240. The multiple devices may or may not be interconnected to form a circuit.

The multiple devices may each be III-nitride based power devices. However, one or more devices may be some other type of device, including a vertical or a lateral conductive device. The multiple devices may be mounted to IMS substrate 202 with each device mounted to a separate pad, for example, or alternatively, multiple devices may be mounted to the same pad. One or more of the devices may be mounted to IMS substrate 202 with the device active area facing upward, as similarly described above for device package 200a, and/or one or more of the devices may be mounted in a flip-chip orientation, as similarly described above for device package 200b.

As an example and as shown in FIG. 2F, device 221 may be a GaN-based bi-directional switching device with first and second gate electrodes 226/227 and first and second source electrodes 222/223, and may be mounted to pad 204*f* of substrate 202 with the device active area facing upward. Device 240 may be a diode with a cathode electrode along the bottom surface of the device (not shown in the Figure) and an anode electrode 241 along the top surface of the device. The diode may be mounted with an electrically conductive adhesive to pad 204*a* of substrate 202 such that the cathode electrode of the diode electrically contacts the pad. Anode electrode 241 of the diode may be bonded by wire bonds 238 to pad 204*b* of substrate 202 and thereby to terminal lead 210. Source electrode 223 of bi-directional switch 221 may be bonded by wire bonds 233 to pad 204*a* and thereby to the cathode electrode of the diode, thus forming a circuit. Additionally, the first and second gate electrodes 226/227 of device 221 may be bonded by wire bonds 236/237 to pads 204*c* and 204*e* and thereby to terminal leads 212 and 216, and source electrode 222 of device 221 may be bonded by wire bonds 232 to pad 204*d* and thereby to terminal lead 214. Again, one skilled in the art will recognize that other device configurations are possible.

Referring now to FIGS. 2G and 2H, there is shown a cross sectional side view and a top view of an example semiconductor device package 200*d* according to another embodiment of the invention. Note that FIG. 2G is seen along line 2G of FIG. 2H and FIG. 2H is seen along line 2H of FIG. 2G. Package 200*d* is similar to device package 200*b*, for example, and includes an IMS substrate 202 and a plurality of terminal leads, such as leads 206-220. Package 200*d* also includes at least one semiconductor device, such as device 221, that is mounted in a flip-chip orientation to substrate 202, and includes a housing 201. According to this embodiment of the invention, device package 200*d* has a single inline package (SIP) format, as illustrated in FIG. 2H.

Specifically, IMS substrate 202 includes along surface 202*a* a plurality of pads, denoted by circuit layer 208 in FIG. 2G. These pads may be formed using thin copper of 1 oz. or less for example, so that the pads have a fine pitch. Again, fine pitch pads may be useful when device 221 is a III-nitride based device. According to this embodiment of the invention, substrate 202 has a size and shape such that package 200*d* conforms to a SIP format.

As shown in FIG. 2H, device package 200*d* may include eight terminal leads 206-220 that provide external access to device 221. One skilled in the art will recognize, however, that device package 200*d* may include more than or fewer than eight leads. As similarly described for device package 200*b*, the bond pads of terminal leads 206-220 may be electrically and directly connected to respective pads of substrate 202 using an electrically conductive adhesive such as solder. As illustrated in FIGS. 2G and 2H, terminal leads 206-220 may be parallel and co-planar with each other and extend from package 200*d* on the same edge beyond the outer boundary of substrate 202 and beyond the periphery of insulated housing 201, thereby allowing for external connection to device 221.

Device 221 may be a III-nitride based power device or some other lateral conductive device, for example. As shown in FIG. 2G, according to this embodiment of the invention device 221 is mounted to the pads of IMS substrate 202 in a flip-chip orientation such that the electrodes along the top surface of the device directly contact the pads of the substrate. As similarly described for device package 200*b*, when device 221 is a III-nitride based device the pads of substrate 202 that receive the power electrodes of the device preferably have an interdigited shape so as to conform to the interdigited power electrodes of the device. Device 221 may also be underfilled, as similarly described above.

Turning to housing 201, this housing may extend over surface 202*a* of IMS substrate 202, covering device 221, the pads of the substrate, and portions of leads 206-220. According to an embodiment of the invention, housing 201 may be over-molded such that surface 202*b* of the substrate is covered, thereby providing additional electrical isolation, as shown in FIG. 2G. Alternatively, according to another embodiment of the invention, housing 201 may not extend to surface 202*b* of the substrate, leaving this surface exposed to enable efficient heat sinking. As shown in FIG. 2H, mounting holes 205*a* and 205*b* may be formed in housing 201 in order to mount device package 200*d* to a heat sink.

According to another embodiment of the invention, rather than device package 200*d* having device 221 mounted in a flip-chip orientation, device package 200*d* may resemble device package 200*a* with device 221 mounted to substrate 202 with the device active area facing upwards and with the device electrodes along the top surface of the device connected to the IMS substrate pads through wire bonds. According to another embodiment of the invention, device package 200*d* may include multiple devices that are interconnected to form a circuit, for example, as similarly described above for device package 200*c*.

Figure 3A:
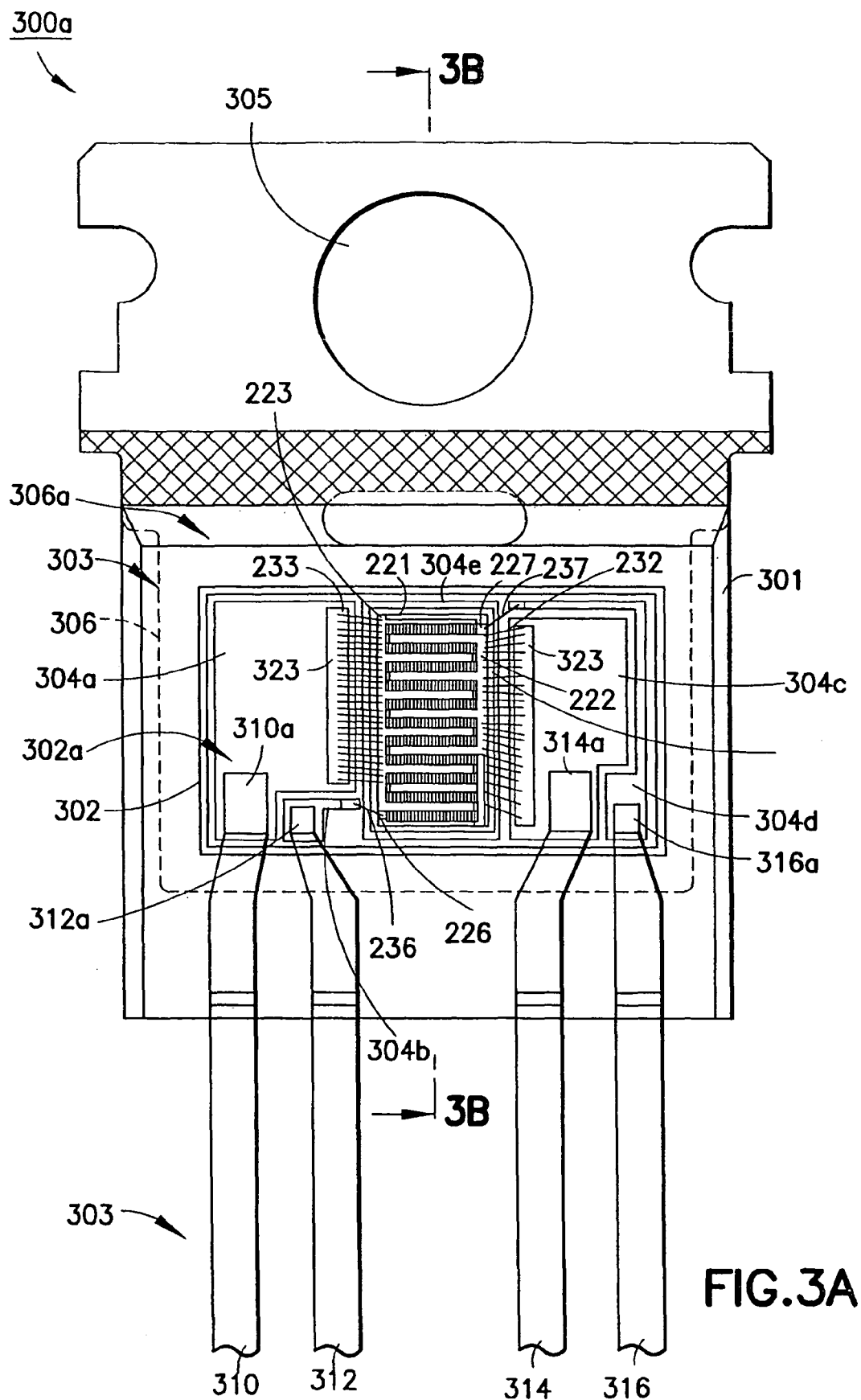

Referring now to FIGS. 3A and 3B, there is shown a top view and a cross sectional side view of a semiconductor device package 300*a* according to another embodiment of the invention. Note that FIG. 3B is seen along line 3B of FIG. 3A and FIG. 3A has the housing shown as see through. Device package 300*a* has a lead frame 303, a package header/base 306, and a plurality of terminal leads, such as leads 310, 312, 314, and 316. Device package 300*a* also includes substrate 302, which is mounted to the top surface 306*a* of package header 306, and at least one semiconductor device, such as device 221, that is mounted on substrate 302. As described below, device 221 has electrodes that are electrically connected to terminal leads 310-316 through the use of substrate 302. As shown in FIG. 3B, device package 300*a* also includes a housing 301. According to an embodiment of the invention, device package 300*a* may conform to a TO style package format, such as a TO-220 package format as shown in FIGS. 3A and 3B, a TO-247 package format, etc. Nonetheless, device package 300*a* is not limited to a TO style package format and may have other forms.

Beginning with package header/base 306 of lead frame 303, this header is made of a high thermal conductivity material such as copper or an alloy of copper for example, and acts as a heat spreader. Package header 306 may have a form that resembles the header of a TO style package, although other package forms may be used. When package header 306 resembles a TO-220 package header for example, a mounting hole 305 may be formed within the tab extension in order to attach the bottom surface 306*b* of the header to a heat sink.

Turning to substrate 302, according to an embodiment of the invention the substrate may be a ceramic substrate, such as an aluminum based ceramic like alumina or aluminum nitride, and may have a thickness of about 0.38 mm, for example. As shown in FIG. 3B, bonded to the top surface 302*a* of substrate 302 is a first conductive layer 307 and bonded to the bottom surface 302*b* of the substrate is a second conductive layer 309, although this second conductive layer is not essential. When both conductive layers are present, substrate 302 is a double sided substrate and when only layer 307 is present, the substrate is a single sided substrate. Conductive layers 307 and 309 may be formed of copper, for example.

According to this embodiment of the invention and as shown in FIG. 3A, conductive layer 307 on the top surface 302a of substrate 302 is patterned, for example, to form a plurality of isolated pads, such as pads 304a, 304b, 304c, 304d, and 304e. One skilled in the art will recognize that device package 300a is not limited to the number, shape, and/or configuration of the pads as shown in FIG. 3A. Over a portion of the top surface 302a of substrate 302 may be a solder mask/solder resist layer (not shown in the Figures) that partially covers pads 304a-304e, for example. The solder mask may be used to confine the conductive adhesive material used in the package assembly to localized pads on the package, thus reducing the risk of bridging two pads and creating an electrical short According to this embodiment of the invention and as shown in FIG. 3B, the bottom surface 302b of substrate 302 is mounted to the top surface 306a of package header 306, thereby exposing pads 304a-304e along the top surface of the substrate. As indicated above, substrate 302 may be either a single or a double sided substrate. When double sided, substrate 302 includes conductive layer 309, which may be formed as a single pad that substantially covers surface 302b of the substrate. When in this form, conductive layer 309 is mounted to header 306. Alternatively, when substrate 302 is single sided, conductive layer 309 is not present, in which case substrate 302 is directly mounted to header 306. Substrate 302 is preferably double sided so as to improve the heat transfer from device 221 through the substrate to header 306. Substrate 302 may be mounted to package header 306 using, for example, a thermally conductive adhesive such as solder, epoxy adhesive, or the like.

According to another embodiment of the invention, rather than using a ceramic substrate, substrate 302 may be an IMS substrate, for example. Here, the bottom surface 202b of the substrate is mounted to package header 306 and the top surface 202a of the substrate includes a plurality of pads, as similarly shown in FIG. 3A.

Referring now to terminal leads 310-316, these leads provide external access to device 221. While device package 300a is shown in FIG. 3A as having four terminal leads, one skilled in the art will recognize that the package may include more than or fewer than four leads. According to an embodiment of the invention and as similarly described for device package 200a, a bond pad 310a-316a of each terminal lead may be electrically and directly connected to a respective pad 304a-304d of substrate 302 using an adhesive. Again, one skilled in the art will recognize that device package 300a is not limited to the configuration of terminal leads to substrate pads as shown in FIG. 3A.

As illustrated in FIGS. 3A and 3B, terminal leads 310-316 may be parallel and co-planar with each other and may extend from package 300a along the same edge beyond the outer boundary of substrate 302 and beyond the periphery of insulated housing 301. Nonetheless, one skilled in the art will recognize that the terminal leads may have other configurations depending on the form of the package. As similarly described for device package 200a, an adjacent pair of leads may be spatially separated at an increased distance in order to separate leads that may interface to high voltage electrodes of device 221.

Referring now to semiconductor device 221, this device may be a III-nitride based power device or some other device including a vertical or a lateral conductive device. As an example and as shown in FIG. 3A, device 221 may be a GaN-based bi-directional switching device that includes first and second gate electrodes 226 and 227 and first and second source electrodes 223 and 222.

According to an embodiment of the invention and as shown in FIG. 3A, device 221 may be mounted to the top surface 302a of substrate 302 with its active area facing upwards and in particular, may be mounted such that the bottom surface of the device is mounted to a pad, such as pad 304e, for example. In this way, the electrodes along the top surface of the device are exposed. According to this embodiment of the invention, the electrodes along the top surface of device 221, such as electrodes 226-227 and 222-223, may be electrically connected through wire bonds, such as bonds 236-237 and 232-233, to the pads of substrate 302 and thereby to terminal leads 310-316. The pads of substrate 302 to which the wire bonds are formed may have a wire bondable body/finish 323 formed of gold for example, to facilitate connecting the bonds to the pads. Again, one skilled in the art will recognize that the device electrode to terminal lead assignments shown in FIG. 3A are an example and can vary depending on the device and/or application.

As shown in FIG. 3A and as similarly described for device package 200a, when device 221 is a III-nitride based device and is mounted with its active area facing upwards, the pads of substrate 302 (such as pads 304a and 304c) that are connected to the power electrodes may be formed to extend substantially along the length of the electrodes/runners. Again, by forming the pads in this fashion, the plurality of wire bonds (such as bonds 232 and 233) that connect each power electrode to a respective pad can be made to have substantially the same length and can be connected substantially in parallel.

According to another embodiment of the invention, device 221 may be mounted to substrate 302 in a flip-chip orientation such that the electrodes along the top surface of the device directly contact the pads of the substrate, as similarly described for device package 200b. Here, the pads of substrate 302 that are intended to contact the electrodes of device 221 are formed to extend within the footprint of device 221. When device 221 is a III-nitride based device, the pads that contact the power electrodes of the device preferably have an interdigited shape to substantially conform to the interdigited electrodes. Again, device 221 may be underfilled to add mechanical stability and to improve reliability.

Referring now to housing 301, when package 300a has the form of a TO-220 package for example, the housing may extend over device 221, pads 304a-304e, wire bonds 232-233 and 236-237 (when present), and portions of leads 310-316, as shown in FIG. 3B. Here, the bottom surface 306b of package header 306 may remain exposed so that this surface may directly contact a heat sink to enable efficient heat sinking. Alternatively, package header 306 may be overmolded such that housing 301 extends over at least a portion of the bottom surface 306b of the header.

According to another embodiment of the invention, device package 300a may include multiple devices that are interconnected to form a circuit, for example, as similarly described above for device package 200c.

Figure 3C:
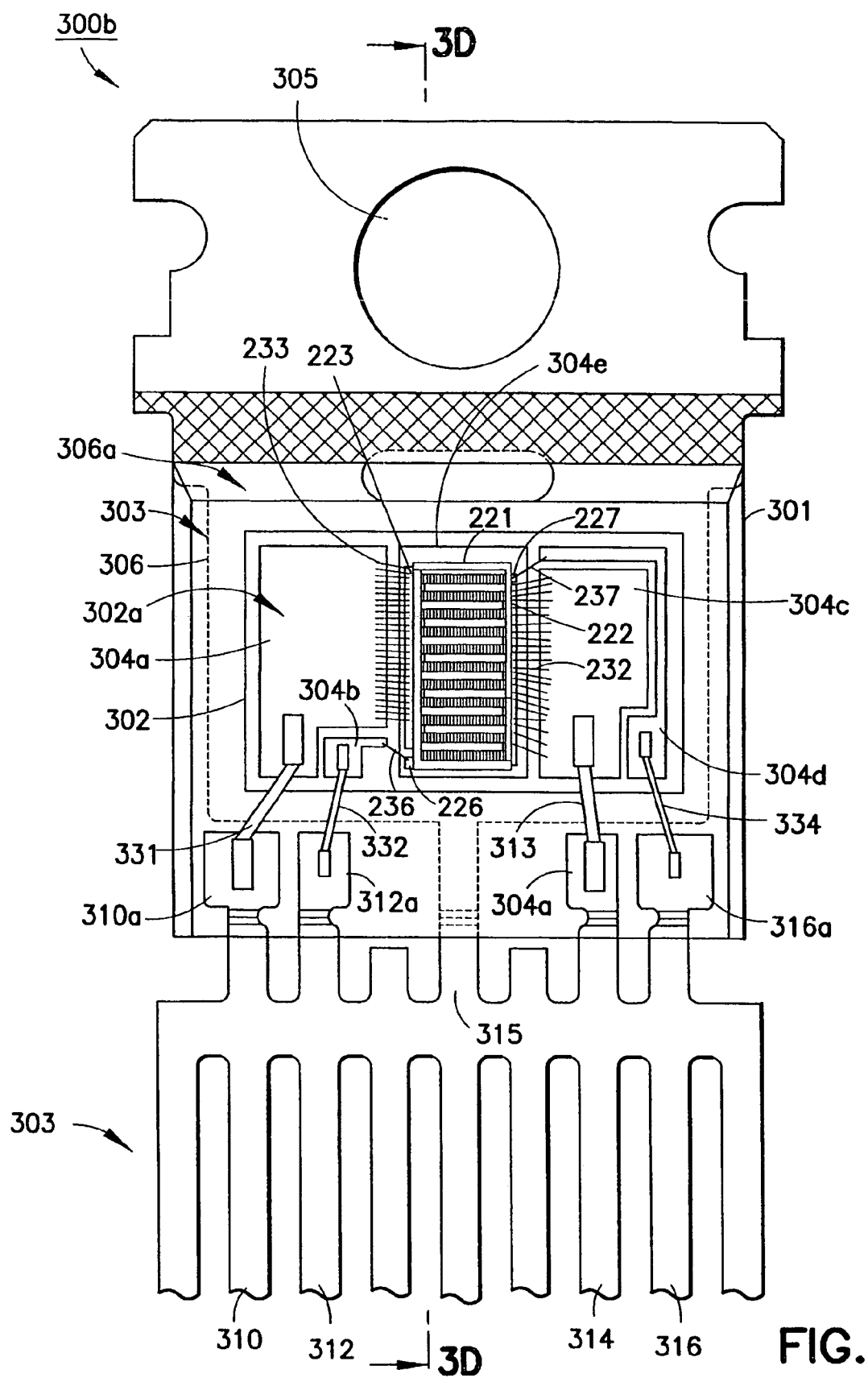

Referring now to FIGS. 3C and 3D, there is shown a top view and a cross sectional side view of a semiconductor device package 300b according to another embodiment of the invention Note that FIG. 3D is seen along line 3D of FIG. 3C and FIG. 3C has the housing shown as see through. Package 300b is substantially similar to package 300a and has a lead frame 303 that includes a package header 306 and a plurality of terminal leads, such as leads 310-316. Device package 300a also includes on the top surface 306a of package header 306 a single or double sided ceramic substrate 302, as shown in FIGS. 3C and 3D, although other types of substrates, such an IMS substrate, may be used. Again, the substrate is mounted along its bottom surface 302b to the package header, thereby exposing the pads 304a-304e along the top surface 302a of the substrate. A semiconductor device, such as device 221, is mounted to the pads on the top surface 302a of substrate 302. According to an embodiment of the invention, device 221 may be mounted with its active area facing upwards as shown in FIG. 3C and as described above for device package 300a. Here, wire bonds, such as bonds 232-233 and 236-237, may connect the electrodes along the top surface of the device to the substrate pads. According to another embodiment of the invention, device 221 may be mounted in a flip-chip orientation, as also described above. As similarly described above, device package 300b may also include multiple devices that may be interconnected to form a circuit, for example.

Turning specifically to terminal leads 310-316, similar to device package 300a, these terminal leads are electrically connected to respective pads, such as pads 304a-304d, of substrate 302, thereby providing external access to device 221. According to this embodiment of the invention, however, rather than directly bonding the bond pads 310a-316a of the terminal leads to the substrate pads as described above, the bond pads are connected to the substrate pads through one or more wire bonds, such as bonds 331, 332, 333, and 334. The wire bonds may be formed, for example, from gold or aluminum. In the case of gold wire bonds, these are likely to be produced using thermosonic ball bonding, while aluminum wire bonds are likely to be processed using ultrasonic wedge bonding. The substrate pads that receive wire bonds 332-334 may have a wire bondable finish/body formed of gold for example, to facilitate connecting the wire bonds to the pads. Assuming pads 304a and 304c of substrate 302 are connected to the power electrodes of device 221, wire bonds 331 and 333, which interface terminal leads 310 and 314 to these pads and thereby to the power electrodes, are preferably large diameter wire bonds, as shown in FIG. 3C. One skilled in the art will recognize that device package 300b is not limited to the configuration of terminal leads to pads as shown in FIG. 3C. For example, two or more leads may be electrically connected to the same pad. In addition, device package 300b is not limited to four terminal leads and may include more than or fewer than four leads.

As shown in FIG. 3C lead frame 303 also includes terminal lead 315, which is integral with header 306. Terminal lead 315 is a tie bar that affixes the terminal lead portion of lead frame 303 to package header 306 during fabrication of the package. Terminal lead 315 may or may not be subsequently clipped/removed.

Referring to FIG. 3D, housing 301 of device package 300b is similar to that of device package 300a and extends at least over device 221, pads 304a-304e, wire bonds 232-233 and 236-237 (when present), and portions of leads 310-316. In addition, the housing now also extends over wire bonds 331-334.

Figure 3E:
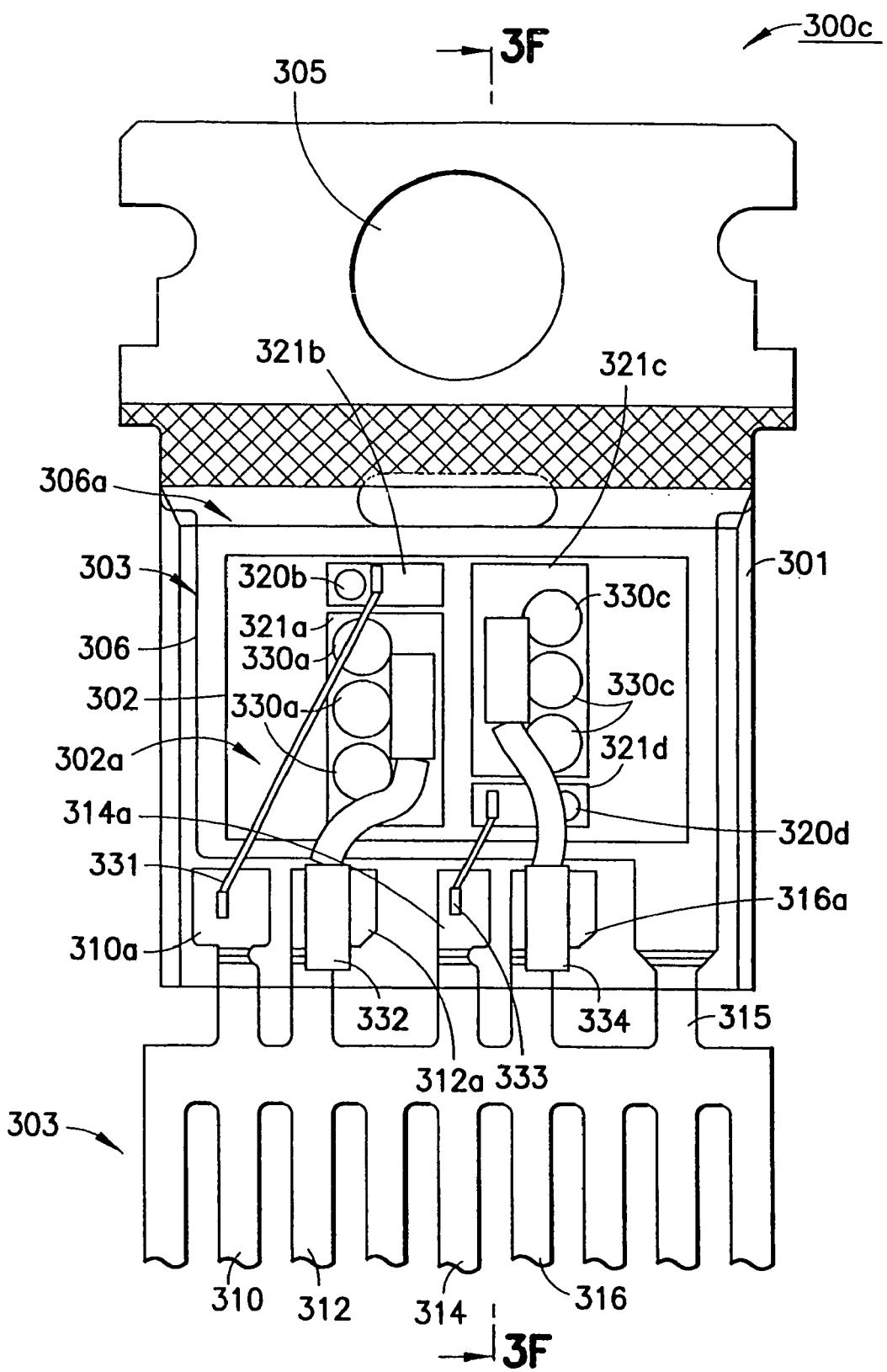

Referring now to FIGS. 3E and 3F, there is shown a top view and a cross sectional side view of a semiconductor device package 300c according to another embodiment of the invention. Note that FIG. 3F is seen along line 3F of FIG. 3E and FIG. 3E has the housing shown as see through. Package 300c is similar to device packages 300a and 300b, for example, and has a lead frame 303 that includes a package header/base 306 and a plurality of terminal leads, such as leads 310-316. As similarly described above, package header 306 is made of a high thermal conductivity material such as copper or an alloy of copper, and may have a form that resembles the header of a TO style package, although other package forms may be used. In addition, device package 300c also includes a substrate 302 and a semiconductor device 221 mounted to the substrate and thereby to terminal leads 310-316. However, as compared to device packages 300a and 300b where device 221 is mounted to substrate 302 and substrate 302 is mounted to package header 306, according to this embodiment of the invention device 221 is now mounted directly to package header 306, thereby improving the heat dissipation of the device.

Specifically, for device packages 300a and 300b, the heat generated by device 221 is passed to substrate 302 and then to package header 306, which acts as a heat spreader. With this configuration, the thermal conductivity of the substrate affects the heat dissipation of device 221. Accordingly, for device packages 300a and 300b, substrate 302 preferably has good thermal conductivity, as is the case with a ceramic substrate or an IMS substrate.

According to this embodiment of the invention and as shown in FIG. 3F, device 221 is now mounted to substrate 302 in a flip-chip orientation and the device and substrate are essentially flipped (as compared to device packages 300a and 300b) so that device 221 is now mounted directly to header 306. Specifically, according to this embodiment of the invention, device 221 is any lateral conductive device, including a III-nitride based power device, that has all device electrodes along the top surface 221a of the device and has a bottom surface 221b that is electrically non-conductive, thereby making this bottom surface a useful thermal contact for heat dissipation. As shown in FIG. 3F, bottom surface 221b of device 221 is directly mounted to the top surface 306a of package header 306 and the electrodes along the top surface 221a of the device are mounted in a flip-chip orientation to the bottom surface 302b of substrate 302. Device 221 may be mounted to package header 306 using a high thermal conductivity material, such as solder, epoxy adhesive, or the like. Accordingly, the heat from device 221 is now directly dissipated to package header 306 rather than from device 221 through substrate 302 and then to package header 306, thereby improving the heat dissipation of the device package. Notably, with this configuration, it is less important that substrate 302 have good thermal conductivity. As such, rather than substrate 302 being a ceramic substrate or an IMS substrate for example, according to this embodiment of the invention the substrate may alternatively be one made from a lower cost substrate, such as an organic substrate made from FR4 resin, a Polyimide resin, a BT resin, or any other suitable substrate known in the art.

Referring now more specifically to substrate 302, according to this embodiment of the invention, device 221 is flip-chip mounted to the bottom surface 302b of the substrate, as indicated above, and terminal leads 310, 312, 314, and 316 are interfaced to the opposing top surface 302a of the substrate, as shown in FIG. 3F. In order to connect the device and the terminal leads to both sides of substrate 302, substrate 302 is double sided with both surfaces being patterned to include a plurality of isolated pads.

Specifically, referring to FIG. 3G, there is shown a bottom view of surface 302b of substrate 302 (as seen along line 3G of FIG. 3F) according to an embodiment of the invention. As shown, surface 302b may include a plurality of pads, such as pads 320a, 320b, 320c, and 320d, that are patterned to receive the electrodes of device 221 (note that FIG. 3G shows device 221 as see through). One skilled in the art will recognize that the bottom surface 302b of substrate 302 is not limited to the number, shape, and/or configuration of the pads as shown in FIG. 3G. Assuming for example purposes that device 221 is a GaN-based bi-directional switching device with first and second gate electrodes and first and second source electrodes as shown in FIG. 3G, the first gate electrode of device 221 may contact pad 320b, the second gate electrode may contact pad 320d, the first source electrode may contact pad 320a, and the second source electrode may contact pad 320c. As similarly described above, when device 221 is a III-nitride based device, the substrate pads (such as pads 320a and 320c) that contact the power electrodes of the device preferably have an interdigited shape to substantially conform to the interdigited electrodes of the device.

Referring again to FIG. 3E, there is shown a top view of surface 302a of substrate 302 according to an embodiment of the invention. Similar to bottom surface 302b, top surface 302a also includes a plurality of pads, such as pads 321a, 321b, 321c, and 321d, formed thereon. Again, one skilled in the art will recognize that the top surface 302a of substrate 302 is not limited to the number, shape, and/or configuration of the pads as shown in FIG. 3E. According to this embodiment of the invention as further described below, terminal leads 310, 312, 314, and 316 may be electrically connected to respective pads 321a-321d through wire bonds (as shown in FIG. 3E) or through direct connection. In addition, according to this embodiment of the invention, one or more of pads 320a-320d on the bottom surface 302b of substrate 302 are in electrical connection with one or more respective pads 321a-321d on the top surface 302a of the substrate. In this way, substrate 302 redistributes the electrodes of device 221 from the bottom surface 302b of the substrate to the pads on the top surface 302a of the substrate, and thereby electrically connects the terminal leads 310, 312, 314, and 316 to the device electrodes.

As shown in FIGS. 3E, 3F, and 3G, in order to electrically connect pads 320a-320d to pads 321a-321d, substrate 302 may include a plurality of plated through hole vias formed therein, such as vias 330a, 330b, 330c, and 330d, that extend between respective pads on the two surfaces (note that FIGS. 3E and 3G show the respective pads as see through in order to show the vias). The plated vias are electrically conductive and thereby electrically connect respective pads. As an example, a plurality of vias 330a may connect pad 320a to pad 321a and thereby connect the first source electrode of device 221 to pad 321a, a plurality of vias 330c may connect pad 320c to pad 321c and thereby connect the second source electrode to pad 321c, via 330b may connect pad 320b to pad 321b and thereby connect the first gate electrode to pad 321b, and via 330d may connect pad 320d to pad 321d and thereby connect the second gate electrode to pad 321d.

Note that FIGS. 3E and 3G show a one-to-one correspondence between the pads on the top and bottom surfaces of the substrate. Nonetheless, one skilled in the art will recognize that device package 300c is not limited to this form. For example, not all pads on the bottom surface of the substrate need to be in electrical connection with pads on the top surface of the substrate and similarly, not all pads on the top surface of the substrate need to be in electrical connection with pads on the bottom surface of the substrate. In addition, a given pad on the bottom surface of the substrate may be redistributed to multiple pads on the top surface of the substrate, etc.

Referring again to terminal leads 310, 312, 314, and 316, as indicated above, these leads are electrically connected to respective pads 321a-321d on the top surface 302a of substrate 302, thereby providing external access to device 221. According to an embodiment of the invention and as illustrated in FIG. 3E, bond pads 310a-316a of the terminal leads may be connected to substrate pads 321a-321d through wire bonds, such as bonds 331, 332, 333, and 334. (Note that terminal lead 315 as shown in FIG. 3E is a tie bar that may or may not be clipped/removed once device package 330c is fabricated) As similarly described for package 300b, wire bonds 331-334 interconnecting the substrate pads to the bond pads may be formed of gold or aluminum. In the case of gold wires, the bonds may be formed using thermosonic ball bonding, while for aluminum wires ultrasonic wedge bonding is the preferred method of manufacture. Again, substrate pads 321a-321d that receive the wire bonds may have a wire bondable body/finish formed of gold for example, to facilitate connecting the wire bonds to the pads. As shown in FIG. 3E, wire bonds 332 and 334, which interface terminal leads 312 and 316 to the power electrodes of device 221, are preferably large diameter wire bonds.

According to another embodiment of the invention, rather than connecting terminal leads 310-316 to substrate pads 321a-321d through wire bonds, the bond pads 310a-316a of the terminal leads may be electrically and directly bonded to the substrate pads, as similarly described for device package 300a, for example.

Again, one skilled in the art will recognize that device package 300c is not limited to the configuration of terminal leads to pads as shown in FIG. 3E. In addition, device package 300c is not limited to four terminal leads and may include more than or fewer than four leads.

Referring again to FIG. 3F and housing 301, this housing may extend at least over device 221, the top surface 302a of substrate 302, wire bonds 331-334 (when present), and portions of leads 310-316, for example. The bottom surface 306b of package header 306 may remain exposed (as shown in FIG. 3F) or alternatively, the package header may be overmolded such that housing 301 extends over at least a portion of the bottom surface 306b of the header.

According to another embodiment of the invention, device package 300c may include multiple devices that may be interconnected to form a circuit, for example, as similarly described above for device package 200c. As an example, the multiple devices may each be lateral conductive devices mounted in a flip-chip orientation to the bottom surface 302b of substrate 302 and in thermal contact with header 306.

As similarly described above, substrate 302 of device packages 300a-300c again operates to re-distribute the electrodes of device 221 to the larger pads of the substrate. As indicated above, such a configuration may be advantageous when the device has small electrodes in that it allows for easier interconnection between the electrodes and the terminal leads of the package.

Figure 4A:
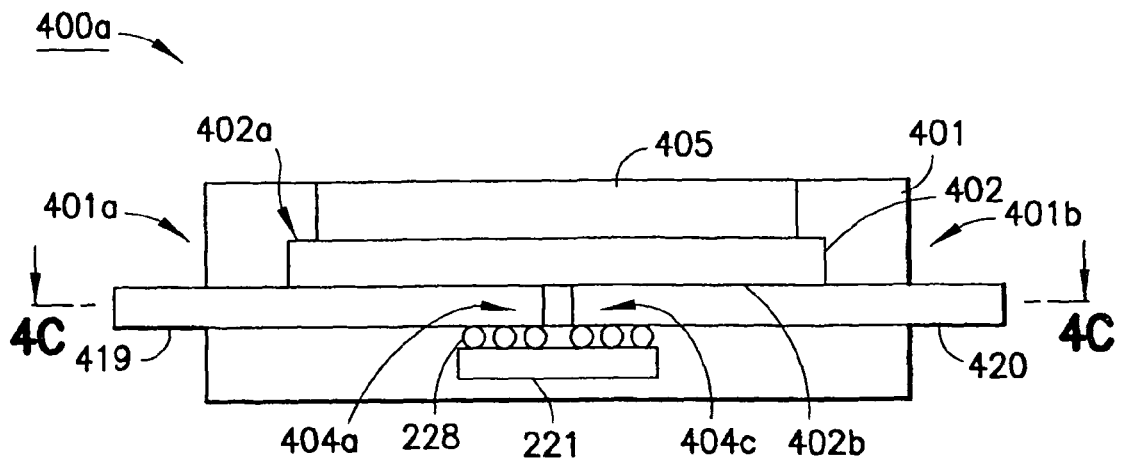
FIG. 4A illustrates a cross sectional side view of a semiconductor device package according to another embodiment of the invention, the package including a substrate with terminal leads mounted along a bottom surface thereof and further including a semiconductor device mounted to pads of the terminal leads.
Figure 4B:
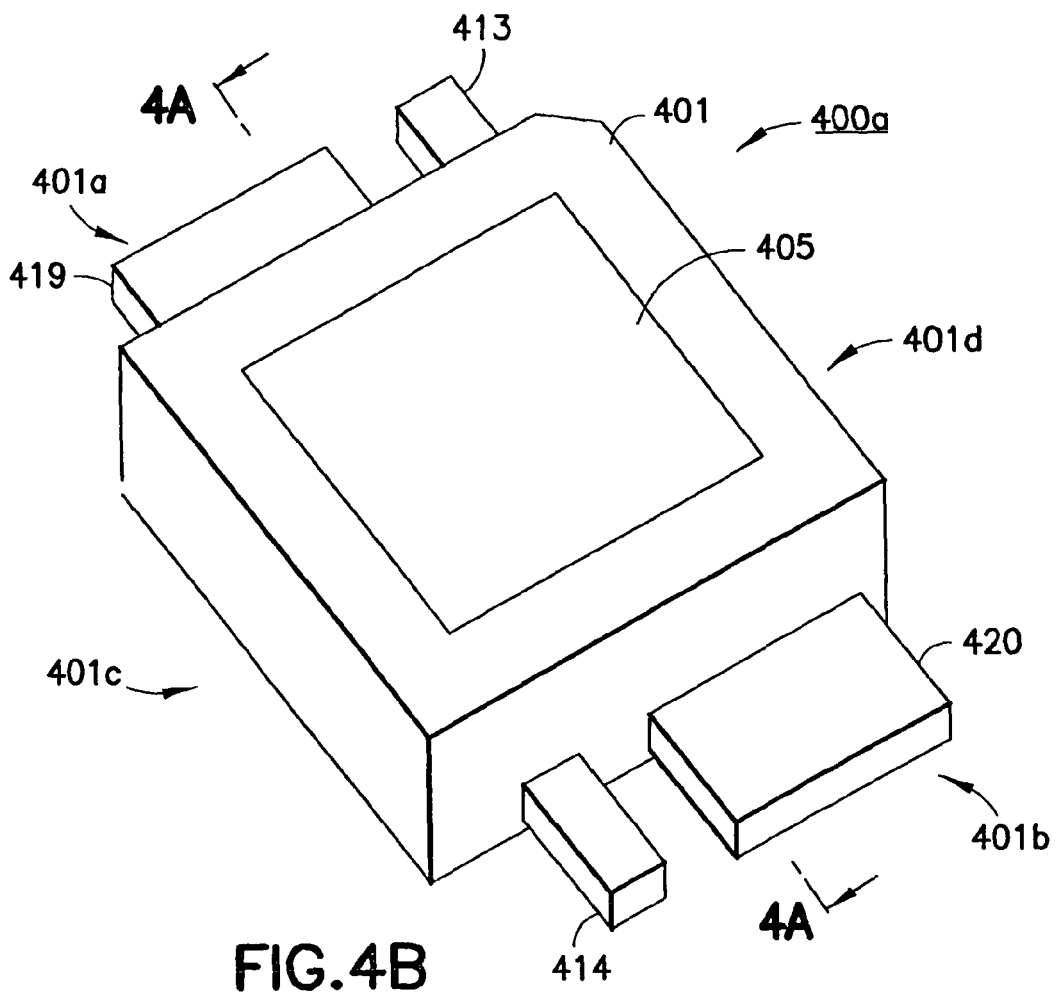
FIG. 4B illustrates a top perspective view of the semiconductor device package of FIG. 4A according to an embodiment of the invention.
Figure 4C:
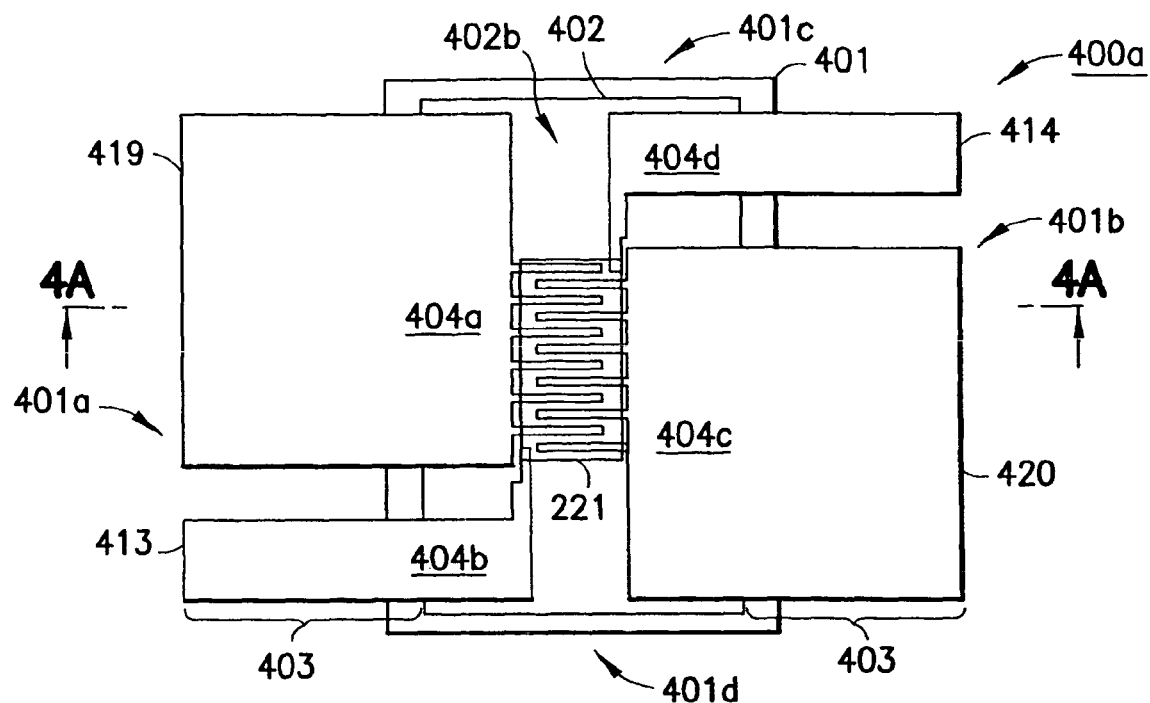
FIG. 4C illustrates a bottom view of the semiconductor device package of FIG. 4A according to an embodiment of the invention.

Referring now to FIGS. 4A, 4B, and 4C there is shown a cross sectional side view, a perspective view, and a bottom view of a semiconductor device package 400a according to another embodiment of the invention. Note that FIG. 4A is seen along line 4A of FIGS. 4B and 4C, and FIG. 4C has the housing and device shown as see through. Device package 400a includes substrate 402 that may be a ceramic substrate, although other substrates may be used. Device package 400a also includes a plurality of terminal leads, such as leads 413, 414, 419, and 420, disposed on bottom surface 402b of substrate 402. Device package 400a further includes at least one lateral conductive semiconductor device, such as device 221, that is mounted to the bottom surface 402b of substrate 402 in a flip-chip orientation and in particular, is mounted in direct electrical contact with leads 413, 414, 419, and 420, as further described below. Device 221 may be any lateral conductive device, including a III-nitride based power device. Device package 400a also includes housing 401 and may further include a heat spreader 405 disposed on a top surface 402*a* of the substrate, although this heat spreader is not essential. According to an embodiment of the invention, device package 400*a* may conform to a through hole package format, such as a dual in-line package (DIP) format. Nonetheless, one skilled in the art will recognize that other package formats may be used.

Referring to FIG. 4C and more specifically to terminal leads 413, 414, 419, and 420, according to this embodiment of the invention, each terminal lead is integral with a respective pad, such as pads 404*a*, 404*b*, 404*c*, and 404*d*, and the leads and pads are directly formed on the bottom surface 402*b* of ceramic substrate 402. The terminal leads and pads may be made of copper and may have a thickness of about 0.25 um. As shown in FIGS. 4B and 4C, the terminal leads may be configured to extend beyond the periphery of substrate 402 and housing 401, thereby allowing for external connection to device 221. In particular, the terminal leads may be configured to be co-planar, with leads 413 and 419 being parallel and extending from a first side 401*a* of package 400*a* and with leads 414 and 420 being parallel and extending from a second opposing side 401*b* of the package.

As indicated above, according to this embodiment of the invention, device 221 is a lateral conductive device mounted within package 400*a* in a flip-chip orientation directly to the terminal leads. More specifically and as shown in FIGS. 4A and 4C, device 221 is mounted in a flip-chip orientation directly on pads 404*a*-404*d* of terminal leads 413, 414, 419, and 420 (again, device 221 is shown as see through in FIG. 4C) and may be underfilled to add mechanical stability and to improve reliability. Accordingly, pads 404*a*-404*d* are configured to receive the electrodes of device 221. For example, assuming device 221 is a GaN-based bi-directional switching device with first and second gate electrodes and first and second source electrodes as shown in FIG. 4C, the first gate electrode of device 221 may contact pad 404*b* and thereby terminal lead 413, the second gate electrode may contact pad 404*d* and thereby terminal lead 414, the first source electrode may contact pad 404*a* and thereby terminal lead 419, and the second source electrode may contact pad 404*c* and thereby terminal lead 420. As similarly described above, when device 221 is a III-nitride based device, the pads (such as pads 404*a* and 404*c*) that contact the power electrodes of the device preferably have an interdigited shape to substantially conform to the interdigited electrodes of the device. One skilled in the art will recognize that package 400*a* is not limited to the number and/or configuration of terminal leads and/or pads as shown in FIG. 4C, with both the number and configuration of the terminal leads and pads depending on the device interfaced to the substrate.

According to an embodiment of the invention and as shown in FIGS. 4B and 4C, a single wide terminal lead, such as leads 419 and 420, may be interfaced to each of the power electrodes of device 221. As an example, these wide leads may have a width that is larger than the width of the terminal leads interfaced to each of the gate electrodes, such as leads 413 and 414. These wide terminal leads reduce package inductance and also improve the transfer of heat from the device package. Nonetheless, one skilled in the art will recognize that the terminal leads of device package 400*a* are not limited to this form and leads 419 and 420 may have widths similar to leads 413 and 414.

According to an embodiment of the invention, device package 400*a* may also include a heat spreader 405, as shown in FIGS. 4A and 4B. This heat spreader may be mounted directly on the top surface 402*a* of ceramic substrate 402 using a high thermal conductivity adhesive. Alternatively, substrate 402 may have a conductive pad mounted on top surface 402*a*, which pad is mounted to the heat spreader. The heat spreader may be formed of copper or some other high thermally conductive material known in the art.

Referring now to housing 401 and FIGS. 4A and 4B, the housing may extend over the top surface 402*a* and bottom surface 402*b* of substrate 402, thereby covering device 221, pads 404*a*-404*d*, and a portion of terminal leads 413, 414, 419, and 420. When package 400*a* includes heat spreader 405, the top surface of this heat spreader may remain exposed beyond housing 401 so that the heat spreader may be attached to a heat sink.

According to another embodiment of the invention, device package 400*a* may include multiple devices that may be interconnected to form a circuit, as similarly described for device package 200*c*. As an example, device package 400*a* may include two lateral conductive switching devices each mounted in a flip-chip orientation to the bottom surface 402*b* of substrate 402 and possibly configured for a half bridge or full bridge application. In order to mount and access the two switching devices, device package 400*a* may include additional pads and/or terminal leads as compared to the configuration shown in FIGS. 4B and 4C. As an example, device package 400*a* may have additional terminal leads arranged in a quad arrangement. In other words, terminal leads may extend from device package 400*a* along sides 401*a* and 401*b*, as shown in FIGS. 4B and 4C, and may also extend from sides 401*c* and 401*d*.

Figure 4D:
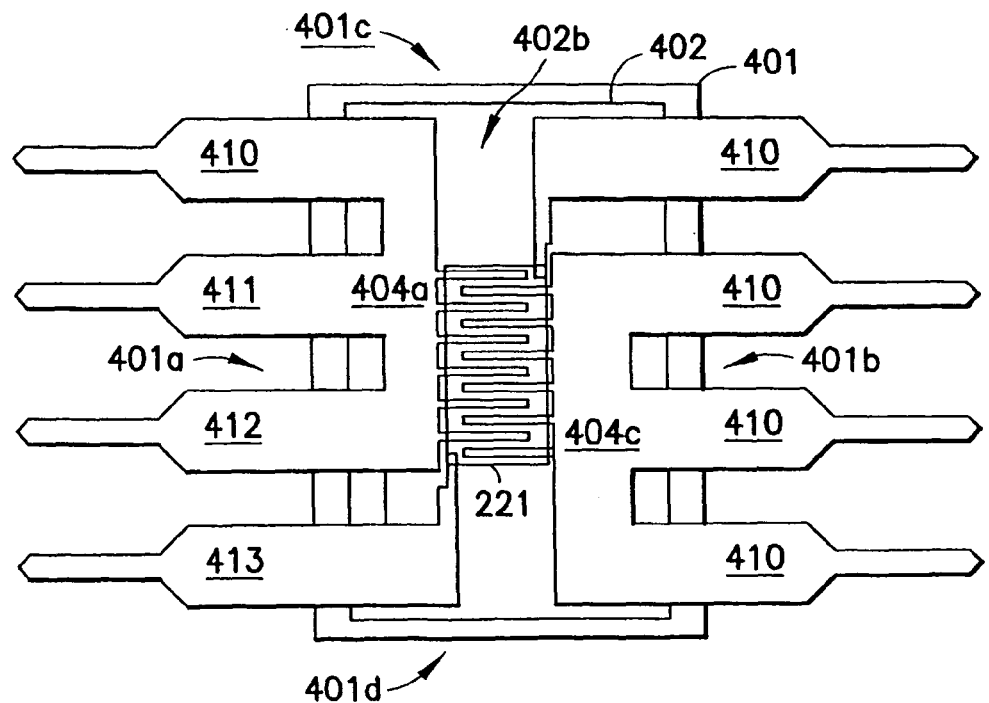
FIG. 4D illustrates a bottom view of a semiconductor device package according to another embodiment of the invention, the package being similar to the device package of FIG. 4A.

One skilled in the art will recognize that device package 400*a* may be fabricated to conform to package formats other than the DIP package format described above. For example, according to another embodiment of the invention, package 400*a* may be fabricated to conform to a PDIP-8 package format. Such a package may substantially resemble package 400*a*, but have a different terminal lead configuration. For example, referring to FIG. 4D there is shown a bottom view of a PDIP-8 package format according to an embodiment of the invention. Note that the view of FIG. 4D is similar to the view of FIG. 4C and has the housing and device shown as see through. As shown, the device package includes eight terminal leads 410-417. Similar to package 400*a*, the terminal leads are directly formed on the bottom surface 402*b* of substrate 402 and are integral with a plurality of pads 404*a*-404*c* to which device 221 is attached in a flip-chip orientation. As shown in FIG. 4D, the terminal leads may be co-planar and may extend beyond the periphery of substrate 402 and housing 401 to allow for external connection to device 221, with leads 410-413 being parallel and extending from a first side 401*a* of the package and leads 414-417 being parallel and extending from a second opposing side 401*b* of the package. As shown, multiple terminal leads (such as leads 410-412 and leads 415-417) may interface the power electrodes of device 221 to improve the transfer of heat from the device package. Similar to package 400*a*, this package may also house multiple devices in which case, terminal leads may extend from all four sides 401*a*-401*c* of the package One skilled in the art will recognize that device package 400*a* may also be fabricated to conform to other through-hole package formats, such as a TO package format, like a TO-220 package format. In the case of the TO package format, the package may substantially resemble package 400*a*, but have terminal leads that extend from the substrate and housing along a common side of the package. Here, heat spreader 405 may be formed as a TO package header. Again, the package may house multiple devices. One skilled in the art will recognize that device package 400*a* may also be fabricated to conform to surface mount package formats, such as a quad flat pack (QFP) package format or an SO package format, such as an SO-8 package format.

Figure 4E:
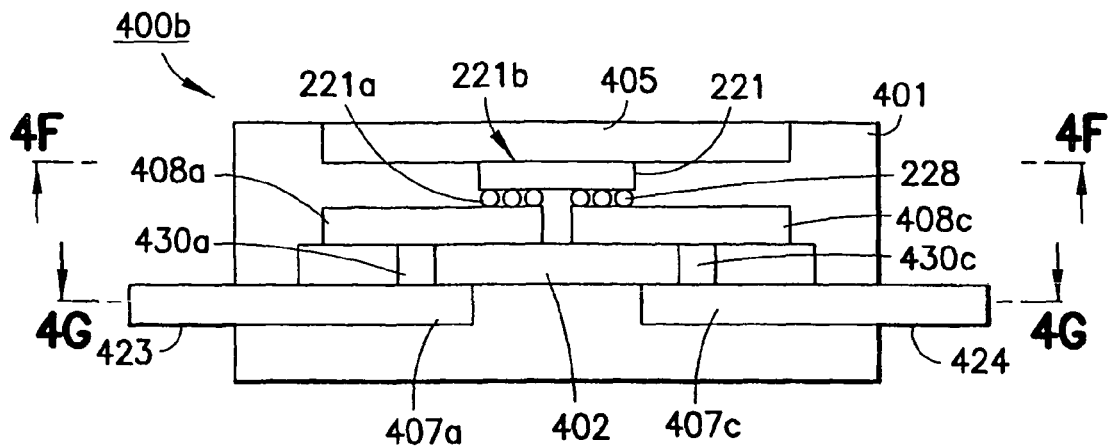
FIG. 4E illustrates a cross sectional side view of a semiconductor device package according to another embodiment of the invention, the package including a semiconductor device with its back side mounted to a heat spreader and its top side electrically connected to a top surface of a substrate, the substrate electrically connecting the device to terminal leads mounted to a bottom surface of the substrate.
Figure 4F:
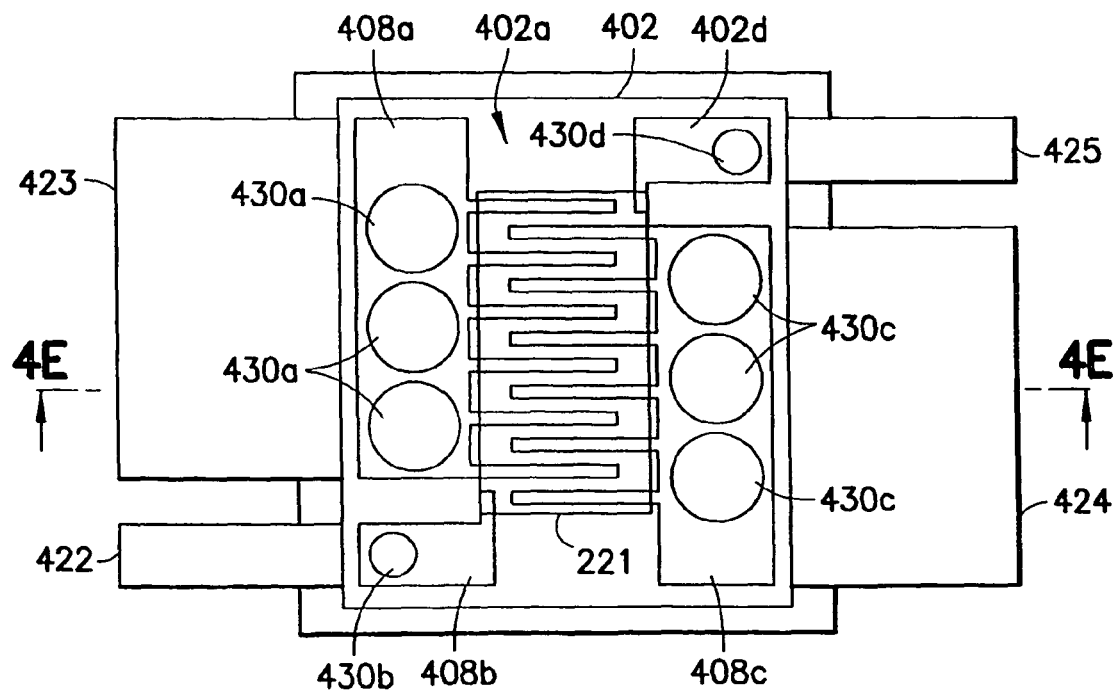
FIG. 4F illustrates a top view of the semiconductor device package of FIG. 4E according to an embodiment of the invention.
Figure 4G:
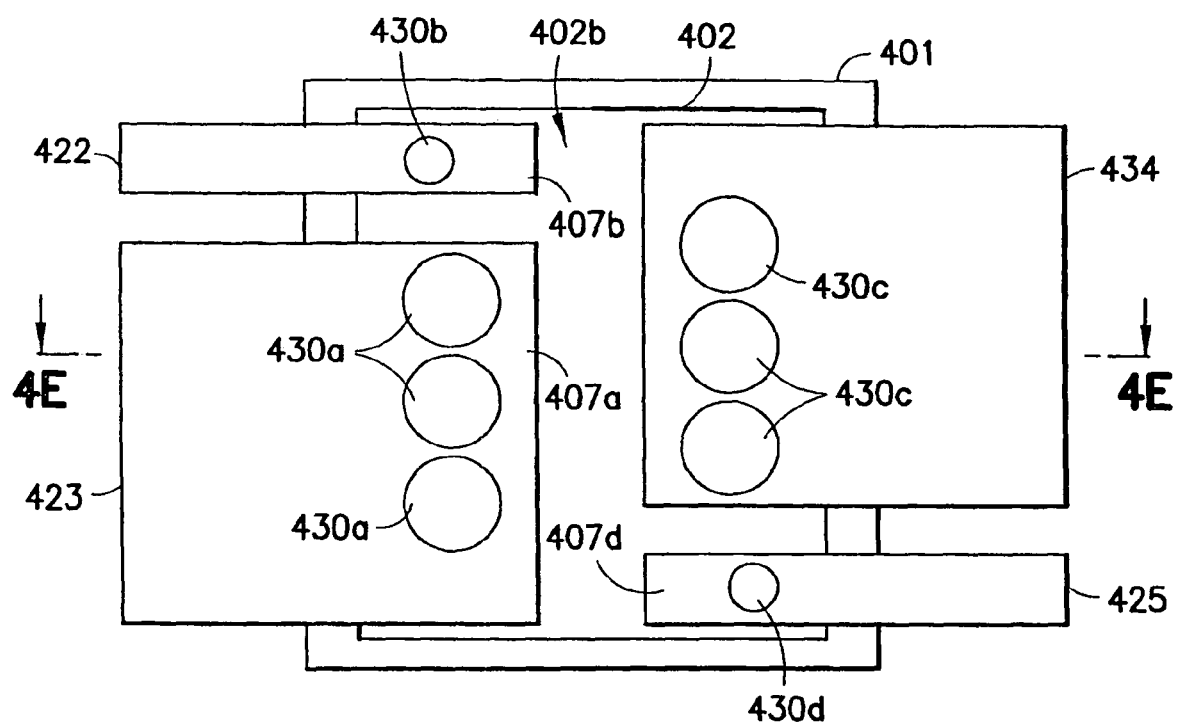
FIG. 4G illustrates a bottom view of the semiconductor device package of FIG. 4E according to an embodiment of the invention.

Referring now to FIGS. 4E, 4F, and 4G, there is shown a cross sectional side view, a top view, and a bottom view of an example semiconductor device package 400b according to another embodiment of the invention. Note that FIG. 4E is seen along line 4E of FIGS. 4F and 4G, and FIGS. 4F and 4G have the housing shown as see through. Package 400b is similar to device package 400a for example, and includes a substrate 402 and a plurality of terminal leads and integral pads, such as leads 422-425/pads 407a-407d, that are formed along the bottom surface 402b of the substrate. Substrate 402 may be manufactured from ceramic or a high Tg material (glass transition temperature), such as FR4, Polyimide, or BT resin. Package 400b also includes at least one semiconductor device, such as device 221. However, rather than mounting device 221 directly to the pads of the terminal leads as described above for device package 400a, substrate 402 now includes along its top surface 402a a plurality of pads, such as pads 408a, 408b, 408c, and 408d, to which device 221 is mounted in a flip-chip orientation. Similar to above, device 221 may be any lateral conductive device, including a III-nitride based power device, and in particular, has a bottom surface 221b that is electrically non-conductive. In order to electrically connect terminal leads 422-425 to the electrodes along the top surface 221a of device 221, package 400b may also include a plurality of conductive vias, such as vias 430a-430d, that extend through substrate 402 between pads 408a-408d and pads 407a-407d of the terminal leads (i.e., a configuration similar to device package 300c). Device package 400b may also include a heat spreader 405, which is now directly mounted to the electrically non-conductive bottom surface 221b of device 221, thereby improving the heat dissipation of the device package. Similar to device package 400a, device package 400b may conform to a DIP package format as shown in FIGS. 4E-4G. Nonetheless, one skilled in the art will recognize that device package 400b may conform to other package formats including TO, QFP, and SO package formats, as similarly described above for device package 400a.

Specifically, referring to FIG. 4F, there is shown a top view of surface 402a of substrate 402 (as seen along line 4F of FIG. 4E) according to an embodiment of the invention. As indicated above and as shown in FIG. 4F, top surface 402a include a plurality of pads 408a-408d. According to this embodiment of the invention, these pads are patterned to receive the electrodes along the top surface 221a of device 221 so that the device may be mounted to the pads in a flip-chip orientation. Again, one skilled in the art will recognize that device package 400b is not limited to the number and/or configuration of the pads as shown in FIG. 4F. Assuming for example purposes that device 221 is a GaN-based bi-directional switching device with first and second gate electrodes and first and second source electrodes, the first gate electrode of device 221 may contact pad 408b, the second gate electrode may contact pad 408d, the first source electrode may contact pad 408a, and the second source electrode may contact pad 408c. Again, when device 221 is a III-nitride based device, the pads (such as pads 408a and 408c) that contact the power electrodes of the device preferably have an interdigited shape, as shown in FIG. 4F.

Referring now to FIG. 4G, there is shown a bottom view of surface 402b of substrate 402 (as seen along line 4G of FIG. 4E) according to an embodiment of the invention. As indicated above, surface 402b includes a plurality of terminal leads 422-425, each of which is integral with a respective pad, such as pads 407a-407d. The terminal leads and pads are directly formed on the substrate surface. Terminal leads 422-425 and pads 407a-407d may be thicker than pads 408a-408d formed on the top surface 402a of substrate 402 and may have a thickness of about 0.25 um, for example. Again, the leads that are intended to interface with the power electrodes of device 221, such as leads 423 and 424, may be formed as wide leads. One skilled in the art will recognize that device package 400b is not limited to the number and/or configuration of the terminal leads and pads as shown in FIG. 4G.

Referring now to FIGS. 4E, 4F, and 4G in order to electrically connect terminal leads 422-425 to the electrodes of device 221, substrate 402 may also include a plurality of conductive vias 430a-430c formed therein that extend between pads 408a-408d on the top surface 402a of the substrate to pads 407a-407d of the terminal leads along the bottom surface 402b of the substrate. Note that FIGS. 4F and 4G show the respective pads as see through in order to show the vias. In this way, substrate 402 redistributes the electrodes of device 221 from the top surface 402a of the substrate to the pads and thereby terminal leads 422-425 on the bottom surface 402b of the substrate, thereby electrically connecting the terminal leads to the device electrodes. As an example, vias 430a may connect pad 408a to pad 407a and thereby connect the first source electrode of device 221 to terminal lead 423, vias 430c may connect pad 408c to pad 407c and thereby connect the second source electrode to terminal lead 424, via 430b may connect pad 408b to pad 407b and thereby connect the first gate electrode to terminal lead 422, and via 430d may connect pad 408d to pad 407d and thereby connect the second gate electrode to terminal lead 425.

Note that while FIGS. 4F and 4G show a one-to-one correspondence between pads 408a-408d and pads 407a-407d, one skilled in the art will recognize that device package 400b is not limited to this form and other interconnections may be used.

According to an embodiment of the invention, device package 400b may also include a heat spreader 405, as shown in FIG. 4E. This heat spreader may be mounted directly to the electrically non-conductive bottom surface 221b of device 221 using a high thermal conductivity adhesive such as solder, epoxy adhesive, or the like. This heat spreader may be formed of copper or some other high thermally conductive material known in the art.

Referring now to housing 401, the housing may extend over the top and bottom surfaces of substrate 402, thereby covering device 221, pads 408a-408d, pads 407a-407d, and a portion of terminal leads 422-425. When package 400b includes heat spreader 405, the top surface of this heat spreader may remain exposed beyond housing 401 so that the heat spreader may be attached to a heat sink.

According to another embodiment of the invention, device package 400b may include multiple lateral conductive devices each mounted to the top surface 402a of substrate 402 and thermally interfaced to heat spreader 405. These multiple devices may be interconnected to form a circuit. For example, device package 400b may include multiple switching devices configured for a half bridge or full bridge application. One or more electrodes of the multiple devices may be redistributed to the bottom surface 402b of the substrate and thereby to the terminal leads. As similarly described for device package 400a, the use of multiple devices may result in the device package having additional terminal leads arranged in a quad arrangement. According to another embodiment of the invention, device package 400b may include both lateral and vertical conductive devices for example, mounted to the top surface 402a of substrate 402. Here, if one or more of the vertical conductive devices require connection to an external heat sink, heat spreader 405 may be replaced with an isolated substrate, such as an IMS substrate or a ceramic.

Figure 5A:
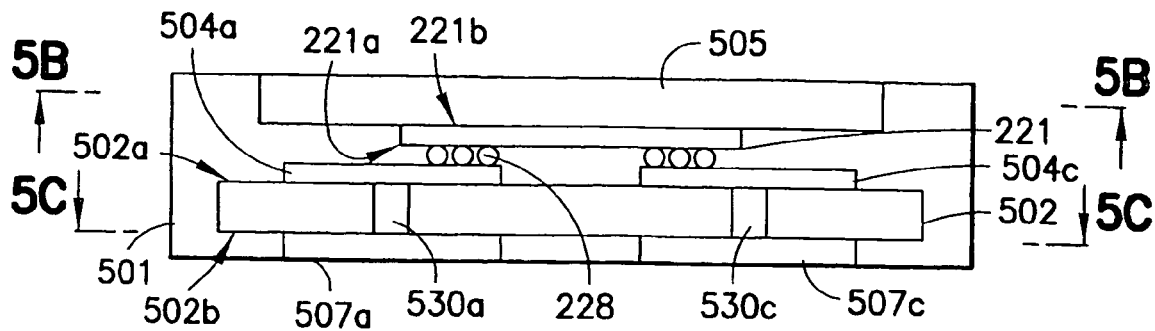
FIG. 5A illustrates a cross sectional side view of a semiconductor device package according to another embodiment of the invention, the package including semiconductor device with its back side mounted to a heat spreader and its top side electrically connected to a top surface of a substrate, the substrate electrically connecting the device to terminal pads that are mounted along a bottom surface of the substrate.
Figure 5B:
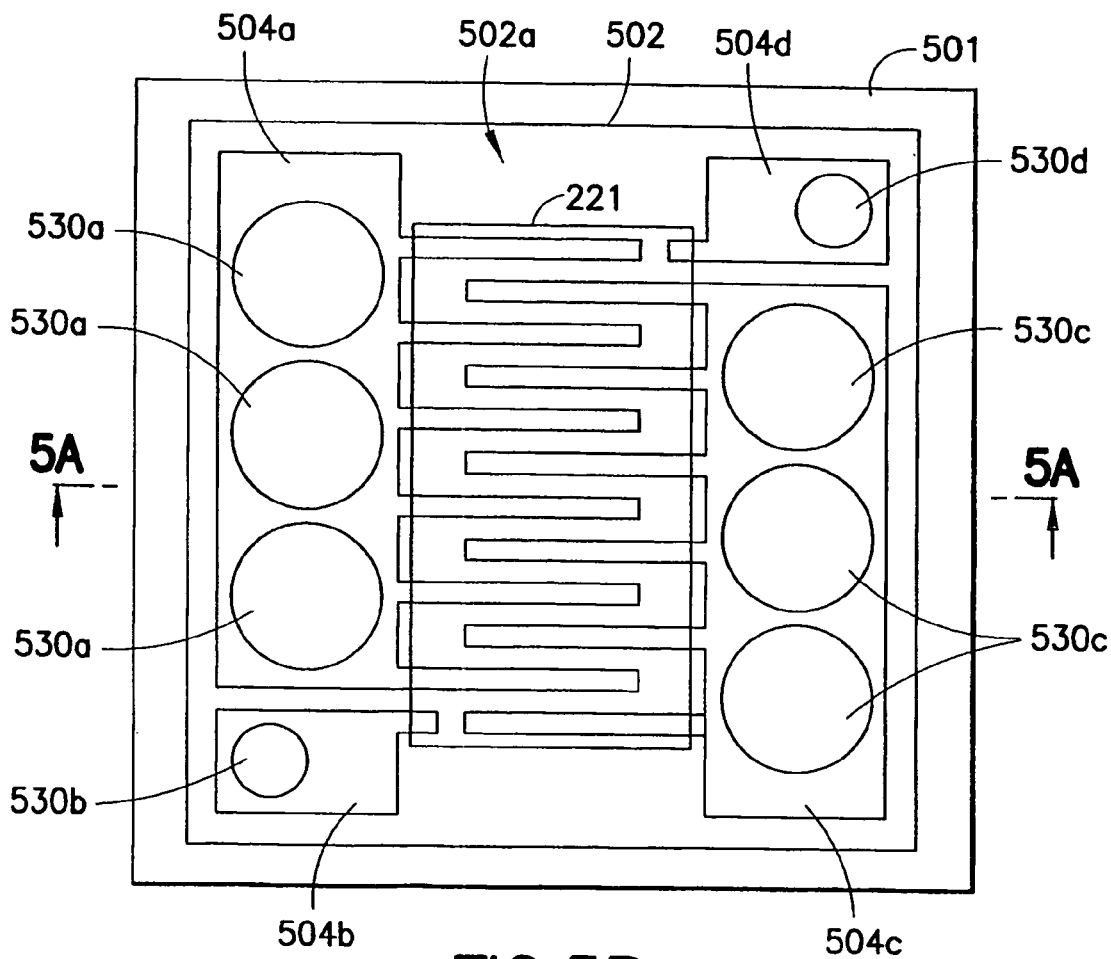
FIG. 5B illustrates a top view of the semiconductor device package of FIG. 5A according to an embodiment of the invention.
Figure 5C:
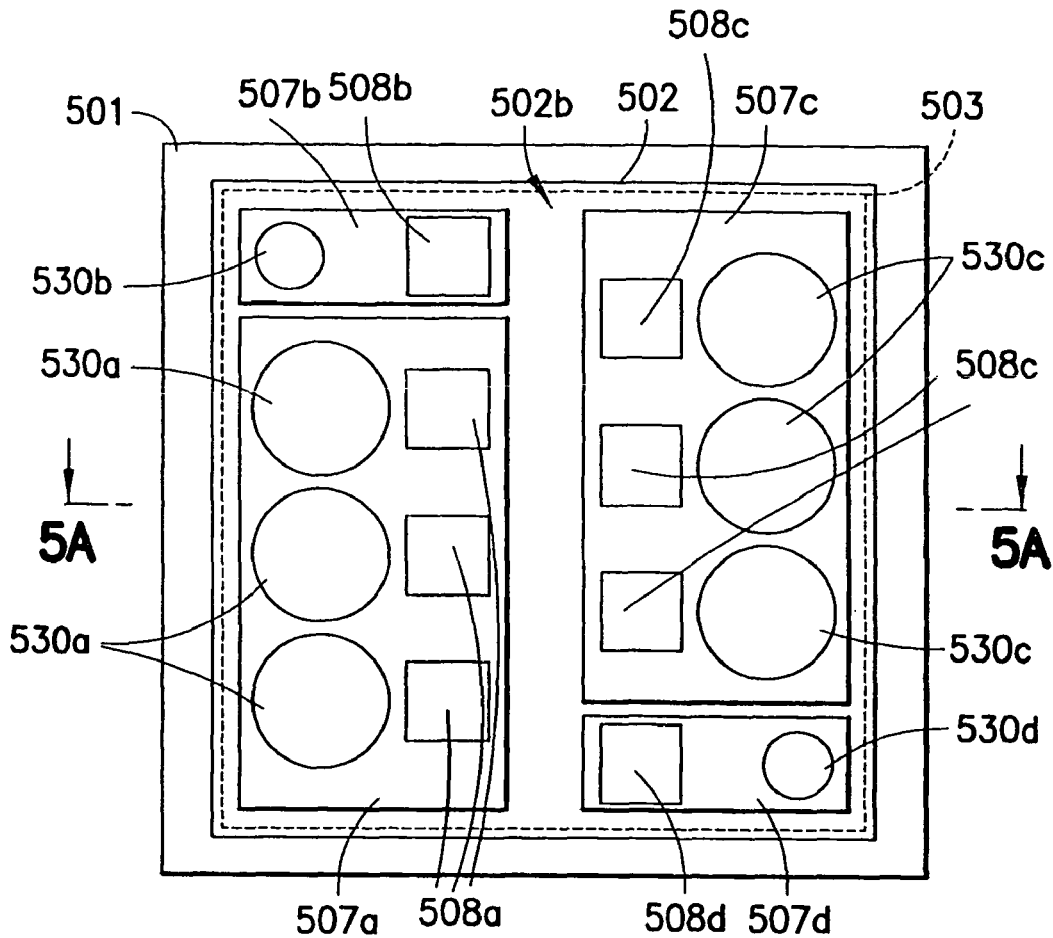
FIG. 5C illustrates a bottom view of the semiconductor device package of FIG. 5A according to an embodiment of the invention.

Referring now to FIGS. 5A, 5B, and 5C there is shown a cross sectional side view, a top view, and a bottom view of a semiconductor device package 500a according to another embodiment of the invention. Note that FIG. 5A is seen along line 5A of FIGS. 5B and 5C, and FIG. 5B has the housing and device shown as see through. Device package 500a includes a substrate 502. Substrate 502 has a plurality of pads, such as pads 504a-504d, disposed along the top surface 502a thereof and also has a plurality of terminal leads formed as terminal pads, such as pads 507a-507d, disposed on a bottom surface 502b thereof, thereby making substrate 502 a double sided substrate. Device package 500a also includes at least one lateral conductive semiconductor device, such as device 221, that has an electrically non-conductive bottom surface 221b. Device 221 may be any lateral conductive device, including a III-nitride based power device. According to this embodiment of the invention, device 221 is mounted in a flip-chip orientation to pads 504a-504d. Device package 500a may also include a plurality of conductive vias, such as vias 530a-530d, that extend through substrate 502 and connect pads 504a-504d to terminal pads 507a-507d, thereby electrically connecting the terminal pads to the electrodes of device 221. Device package 500a also includes a housing 501 and may further include a heat spreader 505 mounted directly to the electrically non-conductive bottom surface 221b of device 221. According to this embodiment of the invention, terminal pads 507a-507d are intended to directly contact the end-user circuit board of a target application. Accordingly, device package 500a has the form of a surface mount device (SMD).

Specifically, beginning with substrate 502, according to this embodiment of the invention the substrate may be a ceramic substrate, an FR4 resin, a Polyimide resin, a BT resin, or some other suitable substrate known in the art. Nonetheless, substrate 502 is preferably a high Tg material so as to be able to withstand the high temperature processes needed to form device package 500a. As indicated above, substrate 502 is double sided in that pads are formed on both the top and bottom surfaces of the substrate.

Referring now to FIG. 5B, there is shown a top view of surface 502a of substrate 502 (as seen along line 5B of FIG. 5A) according to an embodiment of the invention. As indicated above, top surface 502a of the substrate includes a plurality of pads 504a-504d formed thereon. Device 221 is mounted to these pads in a flip-chip orientation and as such, these pads are patterned to receive the electrodes along the top surface 221a of the device (note that device 221 is shown as see through in FIG. 5B). Again, one skilled in the art will recognize that device package 500a is not limited to the number and/or configuration of the pads as shown in FIG. 5B. Device 221 may also be underfilled, as similarly described above. Assuming for example purposes that device 221 is a GaN-based bi-directional switching device with first and second gate electrodes and first and second source electrodes as shown in FIG. 5B, the first gate electrode of device 221 may contact pad 504b, the second gate electrode may contact pad 504d, the first source electrode may contact pad 504a, and the second source electrode may contact pad 504c. Again, when device 221 is a III-nitride based device, the pads (such as pads 504a and 504c) that contact the power electrodes of the device preferably have an interdigited shape, as shown in FIG. 5B.

Referring now to FIG. 5C, there is shown a bottom view of surface 502b of substrate 502 (as seen along line 5C of FIG. 5A) according to an embodiment of the invention. As indicated above, bottom surface 502b includes a plurality of terminal leads formed as terminal pads 507a-507d. These terminal pads are directly formed on and within the boundary of bottom surface 502b of the substrate. These pads may be formed of copper with a solderable plating finish such as nickel gold, for example. As indicated above, terminal pads 507a-507d are intended to be mounted directly to an end-user circuit board, thereby making device package 500a a surface mount device. According to an embodiment of the invention and as shown in FIG. 5C, a layer of solder resist 503 may also partially cover pads 507a-507d. This solder resist layer may have one or more openings formed therein to expose the underlying pads, these openings thereby forming one or more contact pads 508a, 508b, 508c, and 508d that have the form of a land grid array and that contact the end-user circuit board. Again, one skilled in the art will recognize that device package 500a is not limited to the number and/or configuration of the pads and/or land grid array as shown in FIG. 5C.

Referring again to FIGS. 5A, 5B, and 5C, in order to electrically connect the terminal pads 507a-507d to the electrodes of device 221, substrate 502 may also include a plurality of conductive vias 530a-530c formed therein that extend between pads 504a-504d and terminal pads 507a-507d (note that FIGS. 5B and 5C show the respective pads as see through in order to show the vias). In this way, substrate 502 redistributes the electrodes of device 221 from the top surface 502a of the substrate to the terminal pads 507a-507d on the bottom surface 502b of the substrate. As an example, vias 530a may connect terminal pad 507a to pad 504a and thereby to the first source electrode of device 221, vias 530c may connect terminal pad 507c to pad 504c and thereby to the second source electrode, via 530b may connect terminal pad 507b to pad 504b and thereby to the first gate electrode, and via 530d may connect terminal pad 507d to pad 504d and thereby to the second gate electrode.

Note that while FIGS. 5B and 5C show a one-to-one correspondence between pads 504a-504d and terminal pads 507a-507d, one skilled in the art will recognize that device package 500a is not limited to this form and other interconnections may be used as similarly described for device package 300c.

According to embodiment of the invention, device package 500a may also include a heat spreader 505 for improved heat dissipation. This heat spreader may be mounted directly to the electrically non-conductive bottom surface 221b of device 221 using a high thermal conductivity material. This heat spreader may be formed of copper or some other high thermally conductive material known in the art.

Referring to housing 501 and FIG. 5A, this housing may extend over the top surface 502a of substrate 502, thereby covering device 221 and pads 504a-504d. As indicated, terminal pads 507a-507d connect to the target application. Accordingly, housing 501 does not conceal these pads. When package 500a includes heat spreader 505, the top surface of this heat spreader may remain exposed beyond housing 501 so that the heat spreader may be attached to a heat sink.

According to another embodiment of the invention, device package 500a may include multiple lateral conductive devices mounted to the top surface 502a of substrate 502 and thermally interfaced to heat spreader 505. For example, device package 500a may include multiple switching devices configured for a half bridge or full bridge application. One or more electrodes of the multiple devices may be redistributed to the bottom surface 502b of the substrate and thereby to the terminal pads. According to another embodiment of the invention, device package 500a may include both lateral and vertical conductive devices, for example, mounted to the top surface 502a of substrate 502. Here, if one or more of the vertical conductive devices require connection to an external heat sink, heat spreader 505 may be replaced with an isolated substrate, such as an IMS substrate or a ceramic.

Similar to the device packages described above, substrate 502 of device package 500a operates to re-distribute the electrodes of device 221 to the larger pads of the substrate, which pads may be more easily mounted to an end-user circuit board.

Figure 5D:
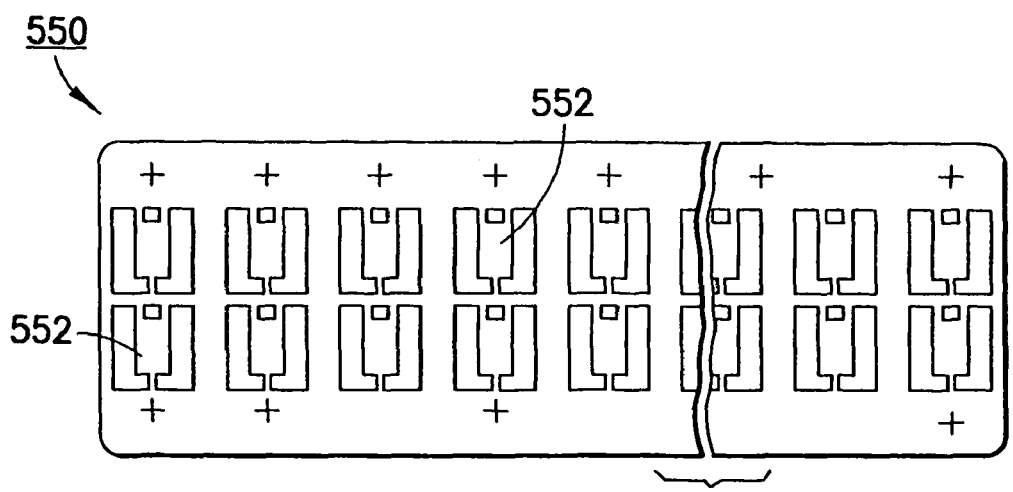
FIG. 5D illustrates a lead frame with a plurality of copper tabs therein, the lead frame and tabs being used to form the heat spreader of the semiconductor device of FIG. 5A according to a fabrication process of an embodiment of the invention.

According to an embodiment of the invention, device package 500a may be fabricated by forming heat spreader 505 as a lead frame so that device 221 may be bonded to the heat spreader using established production device bond techniques. For example, referring to FIG. 5D there is shown an example lead frame 550 in the form of a dual strip array. Lead frame 550 may also be formed as a larger matrix array, for example. As shown in FIG. 5D, lead frame 550 includes a plurality of tabs 552, each which eventually forms a heat spreader 505.

According to an embodiment of the invention, a device package 500a may be formed using lead frame 550 by first die bonding the bottom surface 221b of multiple devices 221 to each of the tabs 552 of lead frame 550 using a high thermal conductivity material. Thereafter, each tab 552/device 221 may be singulated, thereby forming individual assemblies of a device 221 mounted to a tab 552 (i.e., individual assemblies of a device 221 mounted to a heat spreader 505). Each assembly may then be presented for pick and place. Thereafter, given a sheet of substrate 502 having redundant formations of pads 504a-504d on the top surface 502a thereof, each device assembly may be placed face down onto and aligned with a respective set of pads using flip-chip placement equipment. Note that prior to pick and place the device/substrate assemblies may be dipped into solder flux to activate the solder on the solder bumps. A solder reflow may then be performed to form the solder joints. Each device 221 may then be encapsulated using transfer molding, underfill, or a combination of the two. Finally, the individual devices 221 may be singulated by diamond sawing between the devices. Note that an advantage of this packaging process is that the individual devices can be tested while still in matrix form.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device package comprising:
   a power semiconductor device having a first major surface, a second major surface, a first edge extending along a first direction, and a second edge extending along a second direction, said first edge being opposite said second edge;
   a first elongated runner over said first major surface of said power semiconductor device and extending along said first direction;
   a second elongated runner over said first major surface of said power semiconductor device and extending along said second direction;
   a plurality of first power electrodes and a plurality of second power electrodes on said first major surface of said power semiconductor device, said first power electrodes being electrically connected to said first elongated runner and said second power electrodes being electrically connected to said second elongated runner, said first power electrodes and said second power electrodes being disposed between said first elongated runner and said second elongated runner;
   a substrate having a first major surface and a second major surface, said second major surface of said power semiconductor device being thermally coupled to said first major surface of said substrate;
   a first conductive pad and a second conductive pad disposed on said first major surface of said substrate, said first conductive pad extending along said first edge of said power semiconductor device and said second conductive pad extending along said second edge of said power semiconductor device;
   a plurality of spaced first wirebonds connected to said first elongated runner and said first conductive pad;
   a plurality of spaced second wirebonds connected to said second elongated runner and said second conductive pad;
   a first external lead electrically and mechanically coupled to said first conductive pad by a conductive adhesive;
   a second external lead electrically and mechanically coupled to said second conductive pad by a conductive adhesive; and
   a molded housing enclosing at least said power semiconductor device and at least a portion of said first major surface of said substrate.

2. The semiconductor device package according to claim 1, wherein said substrate and said first and second conductive pads constitute an insulated metal substrate.

3. The semiconductor device package according to claim 1, wherein said substrate is comprised of a ceramic.

4. The semiconductor device package according to claim 1, further comprising a heat spreader thermally connected to said second major surface of said power semiconductor device.

5. The semiconductor device package according to claim 1, wherein said package conforms to a TO package format.

6. The semiconductor device package according to claim 1, wherein said package conforms to a single inline package format.

7. The semiconductor device package according to claim 1, wherein said package conforms to a SO package format.

8. The semiconductor device package according to claim 1, further comprising at least a third external lead, wherein each external lead extends beyond an outer boundary of said housing along a single common edge and is adjacent to one or more other external leads, and wherein a spatial separation between one pair of adjacent leads is greater than a spatial separation between each other pair of adjacent leads.

9. The semiconductor device package according to claim 1, further comprising:
   a third conductive pad disposed on said first major surface of said substrate;
   a control electrode on said first major surface of said semiconductor device, said control electrode being electrically connected to said third conductive pad; and
   an external lead electrically connected to said third conductive pad;
   wherein said external lead electrically connected to said first conductive pad and
   said external lead electrically connected to said second conductive pad are wide leads and have a width larger than said external lead connected to said third conductive pad.

10. The semiconductor device package according to claim 1, wherein said plurality of first wirebonds and said plurality of second wirebonds are parallel to one another and of same length.

11. The semiconductor device package according to claim 1, further comprising a heat spreader in thermal contact with said second major surface of said substrate.

12. The semiconductor device package according to claim 1, further comprising:
- a third conductive pad disposed on said first major surface of said substrate; and
- a control electrode on said first major surface of said power semiconductor device,
- said control electrode being electrically connected to said third conductive pad.

13. The semiconductor device package according to claim 12, further comprising:
- a fourth conductive pad disposed on said first major surface of said substrate; and
- a second control electrode on said first major surface of said power semiconductor device, said second control electrode being electrically connected to said fourth conductive pad.

14. The semiconductor device package according to claim 1, wherein said first power electrode and said second power electrode are interdigitated.

15. The semiconductor device package according to claim 1, wherein said second major surface of said power semiconductor device is electrically nonconductive.

16. The semiconductor device package according to claim 1, wherein said power semiconductor device is a III-nitride based device.

17. The semiconductor device package according to claim 16, wherein said power semiconductor device is a GaN based device.

* * * * *